(12) United States Patent
Lee et al.

(10) Patent No.: US 11,172,583 B2
(45) Date of Patent: Nov. 9, 2021

(54) DISPLAY DEVICE

(71) Applicant: LG Display Co., Ltd., Seoul (KR)

(72) Inventors: JaeSung Lee, Seoul (KR); DongYoon Kim, Paju-si (KR); DoJin Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 135 days.

(21) Appl. No.: 16/718,942

(22) Filed: Dec. 18, 2019

(65) Prior Publication Data
US 2020/0214149 A1    Jul. 2, 2020

(30) Foreign Application Priority Data
Dec. 27, 2018    (KR) .......................... 10-2018-0170334

(51) Int. Cl.
| | | |
|---|---|---|
| *H05K 7/00* | (2006.01) | |
| *H05K 5/00* | (2006.01) | |
| *H05K 5/02* | (2006.01) | |
| *H05K 1/14* | (2006.01) | |
| *H05K 1/18* | (2006.01) | |

(52) U.S. Cl.
CPC .......... *H05K 5/0021* (2013.01); *H05K 1/148* (2013.01); *H05K 1/189* (2013.01); *H05K 5/0017* (2013.01); *H05K 5/0234* (2013.01); *H05K 2201/10128* (2013.01); *H05K 2201/10136* (2013.01)

(58) Field of Classification Search
CPC ...... H05K 1/148; H05K 1/189; H05K 5/0021; H05K 5/0017; H05K 2201/101136; H05J 2201/10128

USPC .......................................................... 361/749
See application file for complete search history.

(56) References Cited

U.S. PATENT DOCUMENTS

| | | | |
|---|---|---|---|
| 2010/0202077 A1 | 8/2010 | Kim et al. | |
| 2015/0227171 A1* | 8/2015 | Choi | G06F 1/1652 361/749 |
| 2016/0202729 A1* | 7/2016 | Lee | G06F 1/1652 361/750 |
| 2016/0255713 A1* | 9/2016 | Kim | G02F 1/133305 361/749 |
| 2017/0367198 A1* | 12/2017 | Park | H01L 51/5237 |

FOREIGN PATENT DOCUMENTS

| | | |
|---|---|---|
| CN | 102522049 A | 6/2012 |
| CN | 206564106 U | 10/2017 |
| CN | 206584684 U | 10/2017 |

(Continued)

*Primary Examiner* — Andargie M Aychillhum
(74) *Attorney, Agent, or Firm* — Seed IP Law Group LLP

(57) ABSTRACT

A display system includes a first display coupled to a roller and a second display coupled to the roller such that the first and second displays can be rolled about the roller for storage and transportation and unrolled from the roller to form a large area display. The second rollable display can be rolled about the roller with a rear surface of the second rollable display in direct contact with an outer surface of the roller and the first rollable display can be rolled about the roller with a front surface of the first rollable display in direct contact with a front surface of the second rollable display. First and second flexible films, first and second source printed circuit boards, first and second flexible cables, and first and second control printed circuit boards can be located inside the roller.

35 Claims, 21 Drawing Sheets

(56) References Cited

FOREIGN PATENT DOCUMENTS

| | | | |
|---|---|---|---|
| CN | 107452282 | A | 12/2017 |
| CN | 109087585 | A | 12/2018 |
| KR | 10-2016-0067273 | A | 6/2016 |
| KR | 10-2016-0127275 | A | 11/2016 |

\* cited by examiner

DISPLAY DEVICE

CROSS-REFERENCE TO RELATED APPLICATIONS

This application claims the priority of Korean Patent Application No. 10-2018-0170334 filed on Dec. 27, 2018, in the Korean Intellectual Property Office, the disclosure of which is incorporated herein by reference.

BACKGROUND

Technical Field

The present disclosure relates to a display device, and more particularly, to a rollable display device which can have a large area.

Description of the Related Art

Display devices used for a computer monitor, a TV, a mobile phone, etc., include an organic light-emitting display (OLED) that emits light by itself, a liquid-crystal display (LCD) that requires a separate light source, etc.

As the display devices have been increasingly applied to diverse fields such as a computer monitor, a TV, and a personal mobile device, display devices having a large display area and a reduced volume and weight have been studied.

Recently, a rollable display device in which a display unit, lines, etc., are formed on a flexible substrate made of flexible plastic and which can display an image even when rolled up has attracted attention as a next-generation display device.

In this regard, a TFT process has been performed on a substrate of polyimide (PI) to manufacture a rollable display device. However, due to properties of PI and limitations of the process, it is difficult to implement a large-area rollable display device.

BRIEF SUMMARY

Described herein is a display device in which two or more display units can be tiled.

Also described herein is a display device which can have a large area by tiling two or more display units.

Also described herein is a display device in which the bezel of a large-area display unit can be removed.

A display device may be summarized as comprising: a first display panel and a first back cover coupled to a rear surface of the first display panel; a second display panel and a second back cover coupled to a rear surface of the second display panel, wherein the second display panel is adjacent to the first display panel; and a first roller, wherein a non-active area of the first display panel is located inside the first roller and a non-active area of the second display panel is located inside the first roller, wherein the first roller is configured to wind and unwind the first and second display panels. The display device may further comprise: a flexible film electrically connected to one end of the first display panel; a source printed circuit board electrically connected to the flexible film; a control printed circuit board electrically connected to the source printed circuit board; and a flexible cable that electrically connects the source printed circuit board to the control printed circuit board.

The first roller may be located at a middle of the first and second display panels. The flexible film, the source printed circuit board, the flexible cable, and the control printed circuit board may be in the roller. The first display panel may be rolled inwards and the second display panel may be rolled outwards. The first and second display panels may be wound around an outer surface of the first roller. When the first roller rotates in a first direction, the second display panel may be wound around the first roller by outward rolling so that a rear surface of the second display panel is brought into contact with the outer surface of the first roller and the first display panel may be wound around the first roller by inward rolling so that a front surface of the first display panel is brought into contact with a front surface of the second display panel.

The first roller may include: a core portion, wherein the non-active areas of the first and second display panels are located in the core portion of the first roller; and a body portion fastened to the core portion, wherein the control printed circuit board is located in the body portion. The body portion includes a pressing member configured to fasten the body portion to the core portion or wind or unwind the first and second display panels. The first roller may include a wheeled base portion configured to roll and fix the first and second display panels. The display device may further comprise: a second roller, wherein a second non-active area of the first display panel is located inside the second roller. An end of the first back cover may be fastened to the second roller.

The display device may further comprise: a first support rail fastened to the first roller and to an upper end of the second roller; and a second support rail fastened to the first roller and to a lower end of the second roller. The display device may further comprise: a plurality of fastening members that fasten the first and second support rails to the first roller and to the upper and lower ends of the second roller. The first display panel may be rolled inwards or rolled outwards and the second display panel may be rolled inwards or rolled outwards. A second non-active area of the first display panel and a second non-active area of the second display panel may be edge-bent and tiled to each other, a third non-active area of the first display panel may be edge-bent and wound around a first bending frame, and a third non-active area of the second display panel may be edge-bent and wound around a second bending frame. The first display panel and the second display panel may be fixed by upper and lower fastening members that are inserted into insertion holes in the first and second bending frames.

A display device may be summarized as comprising: a first display panel and a second display panel adjacent to the first display panel; and a first roller, wherein a non-active area of the first display panel is located in the first roller and a non-active area of the second display panel is located in the first roller, wherein the first and second display panels are wound about the first roller. The first display panel may be wound around an outer surface of the first roller by inward rolling and the second display panel may be wound around the outer surface of the first roller by outward rolling. The display device may further comprise: a second roller fastened to a second non-active area of the first display panel, wherein the first display panel is wound around an outer surface of the first roller by inward rolling and the second display panel is wound around the outer surface of the first roller by outward rolling.

A rollable display device may be summarized as comprising: a first rollable display having a first lateral side portion and a second lateral side portion opposite to the first lateral side portion; a second rollable display having a first lateral side portion and a second lateral side portion opposite to the first lateral side portion; and a roller, the second lateral side portion of the first rollable display coupled to the roller and the first lateral side portion of the second rollable display coupled to the roller; wherein the second lateral side portion of the first rollable display is adjacent to the first lateral side portion of the second rollable display. The first rollable display may be a first tile within a large area display and the second rollable display may be a second tile within the large area display. An active area of the first rollable display may not be separated from an active area of the second rollable display by a bezel and the active area of the first rollable display may form a continuous image with the active area of the second rollable display.

The first rollable display may have a top edge and the second rollable display may have a top edge that is continuous with the top edge of the first rollable display; and the first rollable display may have a bottom edge and the second rollable display may have a bottom edge that is continuous with the bottom edge of the first rollable display. The first rollable display and the second rollable display may collectively form a large area display that extends from the first lateral side portion of the first rollable display to the second lateral side portion of the second rollable display. The second rollable display may be rollable about the roller with a rear surface of the second rollable display in direct contact with an outer surface of the roller and the first rollable display may be rollable about the roller with a front surface of the first rollable display in direct contact with a front surface of the second rollable display.

The rollable display may further comprise: a third rollable display having a first lateral side portion and a second lateral side portion opposite to the first lateral side portion; a fourth rollable display having a first lateral side portion and a second lateral side portion opposite to the first lateral side portion; and a second roller, the second lateral side portion of the third rollable display coupled to the second roller and the first lateral side portion of the fourth rollable display coupled to the second roller; wherein the fourth rollable display is rollable about the second roller with a rear surface of the fourth rollable display in direct contact with an outer surface of the second roller and the third rollable display is rollable about the second roller with a front surface of the third rollable display in direct contact with a front surface of the fourth rollable display; wherein the second lateral side portion of the second rollable display is coupled to the first lateral side portion of the third rollable display.

The rollable display device may further comprise: a first source printed circuit board located inside the roller and a second source printed circuit board located inside the roller, the second lateral side portion of the first rollable display coupled to the first source printed circuit board and the first lateral side portion of the second rollable display coupled to the second source printed circuit board; and a first control printed circuit board located inside the roller and electrically coupled to the first source printed circuit board by a first flexible cable and a second control printed circuit board located inside the roller and electrically coupled to the second source printed circuit board by a second flexible cable. The rollable display device may further comprise: a first flexible film inside the roller, wherein the first source printed circuit board is electrically coupled to the first rollable display by the first flexible film; and a second flexible film inside the roller, wherein the second source printed circuit board is electrically coupled to the second rollable display by the second flexible film.

The first flexible film may be electrically coupled to a pad portion of the first rollable display, wherein the pad portion of the first rollable display is located within the roller, and the second flexible film may be electrically coupled to a pad portion of the second rollable display, wherein the pad portion of the second rollable display is located within the roller. The roller may include a core portion and a separate body fastened to the core portion. The first source printed circuit board may be located within the core portion of the roller. A first portion of the first flexible cable may be located within the core portion of the roller and a second portion of the first flexible cable may be located within the separate body of the roller. The first control printed circuit board may be located within the separate body of the roller. The separate body may be fastened to the core portion by a hinge.

Other detailed matters of the exemplary embodiments are included in the detailed description and the drawings.

According to the present disclosure, two or more display units may be tiled to implement a large-area display unit without a decrease in yield, and it is possible to reduce the size of a rolling unit.

According to the present disclosure, the bezel of a large-area display unit can be removed, and, thus, it is possible to improve aesthetics of a display device.

The effects according to the present disclosure are not limited to the contents exemplified above, and more various effects are included in the present specification.

BRIEF DESCRIPTION OF THE SEVERAL VIEWS OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
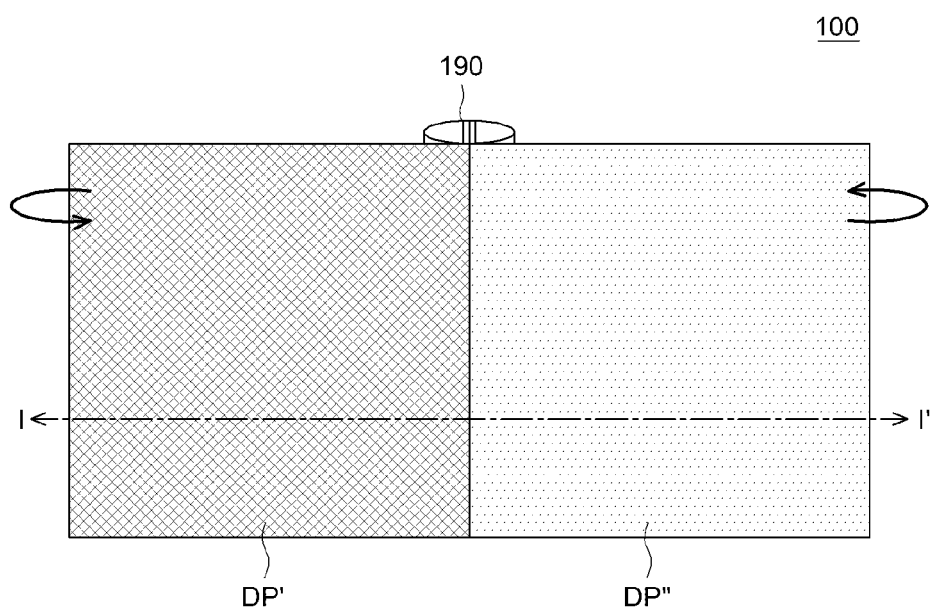
FIG. 1 is a perspective view of a display device according to an embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including" and "having" used herein are generally intended to allow other components to be added unless the terms are used with the term "only." Any references to singular may include plural unless expressly stated otherwise.

Components are interpreted to include an ordinary error range even if not expressly stated.

When the position relation between two parts is described using the terms such as "on," "above," "below," and "next," one or more parts may be positioned between the two parts unless the terms are used with the term "immediately" or "directly."

When an element or layer is disposed "on" another element or layer, another layer or another element may be interposed directly on the other element or therebetween.

Although the terms "first," "second," and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereafter, various embodiments of the present disclosure will be described in detail with reference to the accompanying drawings.

Display Device—Rollable Display Device

A rollable display device may refer to a display device which can display an image even when rolled up. The rollable display device may have higher flexibility than conventional typical display devices. The rollable display device can be freely changed in shape depending on whether the rollable display device is used or not. Specifically, when the rollable display device is not used, the rollable display device can be housed as rolled up to reduce its volume. When the rollable display device is used, the rolled display device can be unrolled.

Figure 2A:
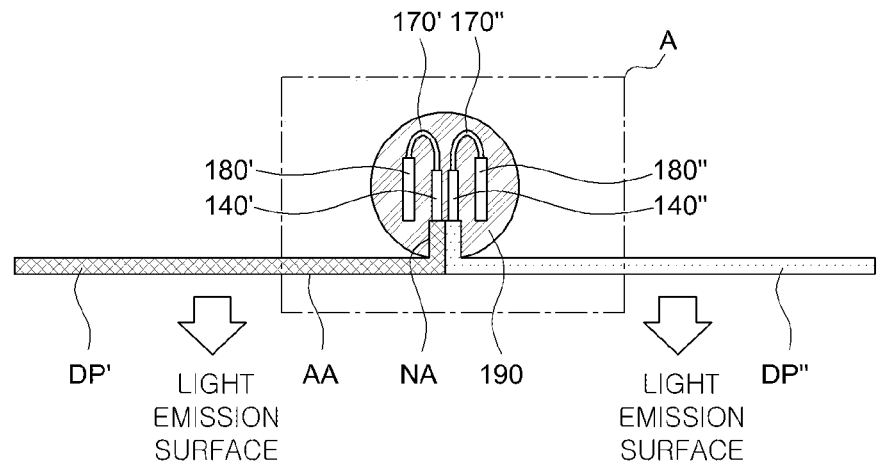
FIG. 2A is a cross-sectional view as taken along a line I-I' of FIG. 1.
Figure 2B:
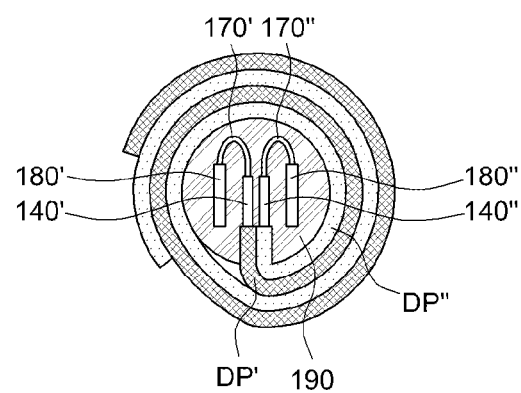
FIG. 2B is a cross-sectional view of the display device of FIG. 1 which is rolled up.

FIG. 1 is a perspective view of a display device according to an embodiment of the present disclosure. FIG. 2A is a cross-sectional view as taken along a line I-I' of FIG. 1. FIG. 2B is a cross-sectional view of the display device of FIG. 1 which is rolled up. Referring to FIG. 1, FIG. 2A, and FIG. 2B, a display device 100 according to an embodiment of the present disclosure may include one or more displays, each of which may be referred as "a display unit," such as display units DP' and DP," and a generally cylindrical roller that provides a mechanical and electrical interface for the display units, about which the displays may be rolled, and which may be referred to as a "rolling unit 190."

The display device 100 according to an embodiment of the present disclosure has a large-area display unit DP' and DP" by tiling two or more display units DP' and DP'" and the rolling unit 190 with a reduced size.

That is, to implement a rollable display device, a display panel may be manufactured and then a glass substrate may be etched to be thin. Otherwise, a display panel may be manufactured using polyimide (PI), which is a plastic material, as a substrate and then glass may be separated from the plastic substrate. However, if a TFT process is performed on the plastic substrate and a display unit is manufactured to have a large area, the yield may decrease due to properties of plastic and limitations of the process. Unlike a conventional glass substrate, the plastic substrate needs an organic film coating, and, thus, the yield may decrease due to plastic particles. As for a large display device unlike a small display device, the total yield is greatly affected even by a single particle.

Accordingly, the present disclosure implements the bezel-less tiled display device 100 including an ultra-large rollable display panel by tiling two or more display units DP' and DP'".

In the display device 100 according to an embodiment of the present disclosure, the large-area display unit DP' and DP" can be implemented without a decrease in yield and the size of the rolling unit 190 can be reduced. A 1-inch increase for a single display unit is accompanied by difficulty in obtaining the yield due to characteristics of a plastic-based process. However, as for the display device 100 according to an embodiment of the present disclosure, two or more display units DP' and DP'" are connected, and, thus, an ultra-large rollable display device can be implemented. Further, the bezel of the large-area display unit DP' and DP"

can be removed, and, thus, aesthetics of the display device can be improved. Accordingly, the tiled display device without the bezel between the display units DP' and DP" can be implemented and it can be expanded infinitely.

The two or more display units DP' and DP" may be tiled to each other at a pad portion or a non-pad portion in a non-active area NA. The tiled pad portions or non-pad portions may be inserted and fastened in the rolling unit 190. For example, as shown in FIG. 2A, edge-bending can be applied to the pad portions in the non-active area NA. Specifically, inward rolling can be applied to the left display unit DP' and outward rolling can be applied to the right display unit DP", which can be expanded infinitely. Herein, the pad portion may refer to a portion of the non-active area NA to which source printed circuit boards 140' and 140" are connected. The non-pad portion may refer to a portion opposite to the pad portion in the non-active area NA. For reference, the inward rolling refers to rolling toward the inside of a light emission surface illustrated in FIG. 2A and the outward rolling refers to rolling toward the outside of the light emission surface. However, the present disclosure is not limited thereto.

In the display device 100 according to an embodiment of the present disclosure, a single rolling unit 190 is disposed in the middle of the display device 100. However, the present disclosure is not limited thereto.

Further, in the display device 100 according to an embodiment of the present disclosure, inward rolling is applied to the left display unit DP' and outward rolling is applied to the right display unit DP". However, the present disclosure is not limited thereto. That is, outward rolling may be applied to the left display unit DP' and inward rolling may be applied to the right display unit DP".

Furthermore, in the display device 100 according to an embodiment of the present disclosure, a tile portion between the display units DP' and DP" is illustrated as disposed at the pad portion in the non-active area NA. In this case, the non-pad portion of the non-active area NA may be located in the lateral outer periphery of the display units DP' and DP". However, the present disclosure is not limited thereto. The tile portion between the display units DP' and DP" may be disposed at the non-pad portion in the non-active area NA.

In the display device 100 according to an embodiment of the present disclosure, when the display units DP' and DP" are rolled up, the volume can be minimized, and the two or more display units DP' and DP" can be tiled infinitely to the left and right sides.

The display units DP' and DP" are configured to display images to a user. For example, display elements, circuits for driving the display elements, lines, and other components may be disposed in the display units DP' and DP". The display device 100 according to an embodiment of the present disclosure is a rollable display device. Therefore, the display units DP' and DP" may be configured to be wound around and unwound from the rolling unit 190. To this end, for example, each of the display units DP' and DP" may include a display panel and a back cover which are flexible so as to be wound or unwound. Specifically, each of the display units DP' and DP" may include a back cover, a display panel, the source printed circuit boards 140' and 140", flexible cables 170' and 170", and control printed circuit boards 180' and 180".

Each source printed circuit board 140' and 140" is disposed on one end of a flexible film (not shown) and connected to the flexible film. The source printed circuit boards 140' and 140" are configured to supply signals to driver ICs. The source printed circuit boards 140' and 140" supply various signals such as a drive signal, a data signal, etc., to the driver ICs.

The flexible cables 170' and 170" electrically connected to ends of the source printed circuit boards 140' and 140" may be provided. Specifically, one end of each of the flexible cables 170' and 170" may be connected to one of the source printed circuit boards 140' and 140" and the other end may be connected to one of the control printed circuit boards 180' and 180". Thus, the source printed circuit boards 140' and 140" and the control printed circuit boards 180' and 180" can be electrically connected to each other.

The control printed circuit boards 180' and 180" may be disposed on the other ends of the flexible cables 170' and 170". Specifically, the control printed circuit boards 180' and 180" may be disposed as electrically connected to the source printed circuit boards 140' and 140" through the flexible cables 170' and 170". The source printed circuit boards 140' and 140", the flexible cables 170' and 170", and the control printed circuit boards 180' and 180" may be provided as inserted in the rolling unit 190. However, the present disclosure is not limited thereto.

The display units DP' and DP" will be described in more detail with reference to FIG. 3 through FIG. 6B.

In the rolling unit 190, the pad portions or the non-pad portions of the non-active area NA of the display units DP' and DP" may be housed and fastened. Each of the display units DP' and DP" may be housed as wound around an outer surface of the rolling unit 190 by inward rolling and/or outward rolling. However, the present disclosure is not limited thereto.

FIG. 1 and FIG. 2A show a full unwinding state of the display units DP' and DP" of the display device 100. The full unwinding state refers to a state where the display units DP' and DP" of the display device 100 are unwound and fully spread. That is, the full unwinding state can be defined as a state where the display units DP' and DP" are unwound and spread to a maximum so as not to be further unwound in order for the user to watch images on the display device 100.

FIG. 2B shows a full winding state of the display units DP' and DP" of the display device 100. The full winding state refers to a state where the display units DP' and DP" of the display device 100 is housed as wound around the outer surface of the rolling unit 190 by inward rolling and/or outward rolling and cannot be further wound. That is, the full winding state can be defined as a state where the display units DP' and DP" are housed as wound around the outer surface of the rolling unit 190 by inward rolling and/or outward rolling when the user does not watch images on the display device 100. This is because the display units DP' and DP" wound around the outer surface of the rolling unit 190 is preferable for the sake of external appearance. In this case, the display device 100 is reduced in volume and easy to transport.

For example, when the rolling unit 190 rotates in a first direction, i.e., clockwise when viewed from above, the right display unit DP" may be wound around the rolling unit 190 by outward rolling. Thus, a rear surface of the right display unit DP" may be brought into close contact with the outer surface of the rolling unit 190. Also, the left display unit DP' may be wound around the rolling unit 190 by inward rolling, and, thus, a front surface of the left display unit DP' may be brought into close contact with a front surface of the right display unit DP".

On the contrary, when the rolling unit 190 rotates in a second direction, i.e., counterclockwise when viewed from above, the left display unit DP' may be wound around the rolling unit 190 by outward rolling. Thus, a rear surface of the left display unit DP' may be brought into close contact with the outer surface of the rolling unit 190. Also, the right display unit DP'' may be wound around the rolling unit 190 by inward rolling, and, thus, the front surface of the right display unit DP'' may be brought into close contact with the front surface of the left display unit DP'.

Display Unit

Figure 3:
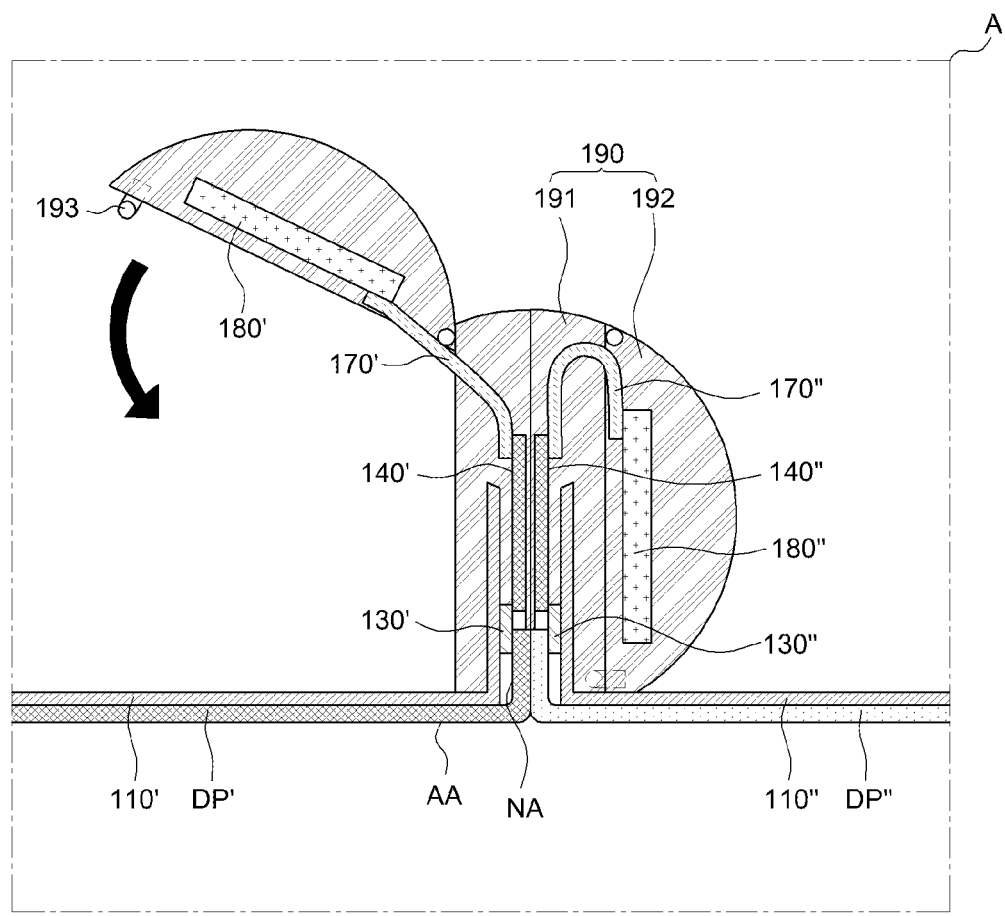
FIG. 3 is an enlarged view of a region "A" of FIG. 2A with the display device in a different configuration than that illustrated in FIG. 2A.
Figure 4:
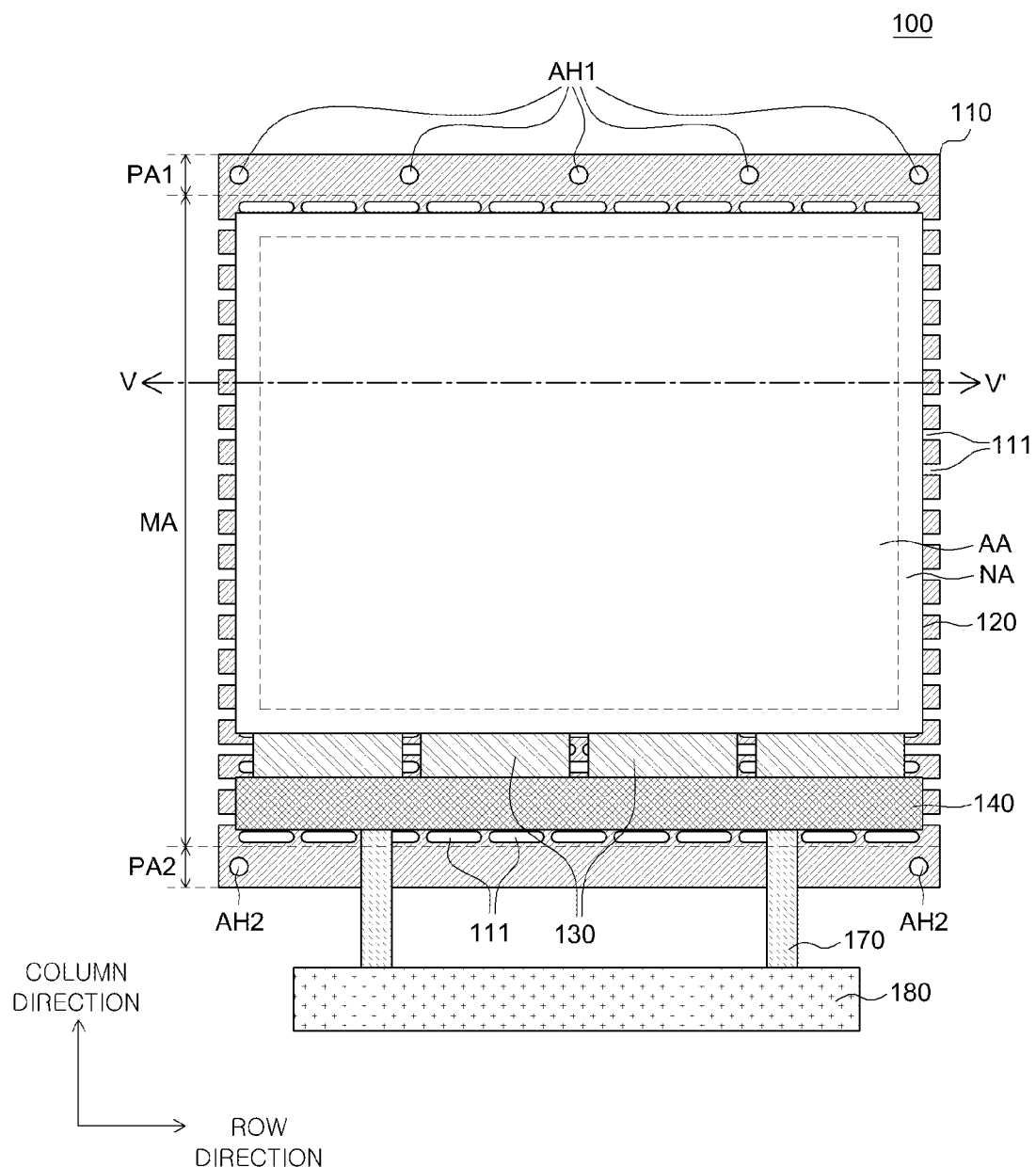
FIG. 4 is a plan view of a display unit of the display device according to an embodiment of the present disclosure.
Figure 5:
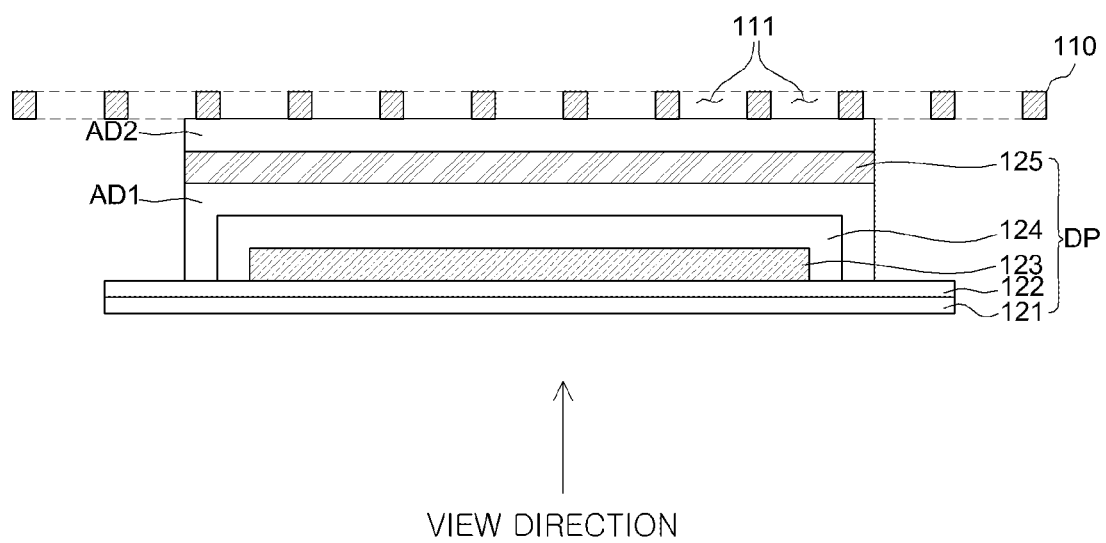
FIG. 5 is a cross-sectional view as taken along a line V-V' of FIG. 4.

FIG. 3 is an enlarged view of a region "A" of FIG. 2A. FIG. 4 is a plan view of a display unit of the display device according to an embodiment of the present disclosure. FIG. 5 is a cross-sectional view as taken along a line V-V' of FIG. 4. The display device 100 illustrated in FIG. 4 and FIG. 5 can be applied to both the left and right display units DP' and DP''. For the convenience of description, symbols ' and "are omitted from reference numerals. FIG. 4 shows an example where left or right ends of the display units DP' and DP'' illustrated in FIG. 3 are disposed on an upper side of FIG. 4, for the convenience of description. However, the present disclosure is not limited thereto.

Referring to FIG. 3 through FIG. 5, the display unit DP (DP' and DP'') includes a back cover 110 (110' and 110''), a display panel 120 (120' and 120''), a flexible film 130 (130' and 130''), a source printed circuit board 140 (140' and 140''), a flexible cable 170 (170' and 170''), and a control printed circuit board 180 (180' and 180''). The display panel 120 (120' and 120'') is configured to display images to the user. In the display panel 120 (120' and 120''), display elements for displaying images, driving elements for driving the display elements, and lines for transmitting various signals to the display elements and the driving elements may be disposed. The display elements may be defined differently depending on the kind of the display panel 120 (120' and 120''). For example, if the display panel 120 (120' and 120'') is an organic light emitting display panel, the display elements may be organic light emitting elements each composed of an anode, an organic emission layer, and a cathode. For example, if the display panel 120 (120' and 120'') is a liquid crystal display panel, the display elements may be liquid crystal display elements. Hereinafter, the display panel 120 (120' and 120'') will be assumed as an organic light emitting display panel, but the display panel 120 (120' and 120'') is not limited to the organic light emitting display panel. Further, since the display device 100 according to an embodiment of the present disclosure is a rollable display device, the display panel 120 (120' and 120'') may be implemented as a flexible display panel to be wound or unwound.

The display panel 120 (120' and 120'') may include an active area AA and a non-active area NA.

The active area AA refers to an area where an image is displayed on the display panel 120 (120' and 120''). In the active area AA, a plurality of sub-pixels that forms a plurality of pixels and a circuit for driving the plurality of sub-pixels may be disposed. The plurality of sub-pixels is a minimum unit of the active area AA, and a display element may be disposed on each of the plurality of sub-pixels. The plurality of sub-pixels may form a pixel. For example, an organic light emitting element composed of an anode, an organic emission layer, and a cathode may be disposed on each of the plurality of sub-pixels, but the present disclosure is not limited thereto. Further, the circuit for driving the plurality of sub-pixels may include a driving element and a line. For example, the circuit may be composed of a thin film transistor (TFT), a storage capacitor, a gate line, a data line, etc., but is not limited thereto.

The non-active area NA refers to an area where an image is not displayed. In the non-active area NA, various lines and circuits for driving the organic light emitting elements in the active area AA may be disposed. For example, link lines for transmitting signals to the plurality of sub-pixels and circuits in the active area AA or driver ICs such as a gate driver IC and a data driver IC may be disposed in the non-active area NA. However, the present disclosure is not limited thereto.

One end of the non-active area NA may be referred to as a pad portion and may be inserted and fastened in the rolling unit 190.

The flexible film 130 (130' and 130'') includes various components on a flexible base film. Specifically, the flexible film 130 (130' and 130'') serves to supply signals to the plurality of sub-pixels and circuits in the active area AA. The flexible film 130 (130' and 130'') may be electrically connected to the display panel 120 (120' and 120''). The flexible film 130 (130' and 130'') is disposed on one end of the non-active area NA, i.e., a pad portion, of the display panel 120 (120' and 120'') and supplies power voltage, data voltage, etc., to the plurality of sub-pixels and circuits in the active area AA. FIG. 4 illustrates four flexible films 130 (130' and 130''). However, the number of flexible films 130 (130' and 130'') is not limited thereto and may be changed variously depending on the design.

On the flexible film 130 (130' and 130''), driver ICs such as a gate driver IC and a data driver IC may be disposed. The driver ICs are configured to process data for displaying an image and a driving signal for processing the data. The driver ICs may be mounted in a Chip On Glass (COG) method, a Chip On Film (COF) method, or a Tape Carrier Package (TCP) method. For the convenience of description, the driver ICs are described as mounted on the flexible film 130 (130' and 130'') in the COF method, but the present disclosure is not limited thereto.

The source printed circuit board 140 (140' and 140'') is disposed on one end of the flexible film 130 (130' and 130'') and connected to the flexible film 130 (130' and 130''). The source printed circuit board 140 (140' and 140'') is configured to supply signals to the driver ICs. The source printed circuit board 140 (140' and 140'') supplies various signals such as a drive signal, a data signal, etc., to the driver ICs. For example, in the source printed circuit board 140 (140' and 140''), a data driver that generates data signals may be mounted. The generated data signals may be supplied, through the flexible film 130 (130' and 130''), to the plurality of sub-pixels and circuits in the display panel 120 (120' and 120''). FIG. 4 illustrates a single source printed circuit board 140 (140' and 140''). However, the number of source printed circuit boards 140 (140' and 140'') is not limited thereto and may be changed variously depending on the design.

The flexible cable 170 (170' and 170'') electrically connected to one end of the source printed circuit board 140 (140' and 140'') may be provided. For example, one end of the flexible cable 170 (170' and 170'') may be connected to the source printed circuit board 140 (140' and 140'') and the other end may be connected to the control printed circuit board 180 (180' and 180''). Thus, the source printed circuit board 140 (140' and 140'') and the control printed circuit board 180 (180' and 180'') can be electrically connected to each other. The flexible cable 170 (170' and 170'') may be, for example, a flexible flat cable (FFC), but is not limited thereto.

The control printed circuit board 180 (180' and 180'') may be disposed on the other end of the flexible cable 170 (170' and 170''). Specifically, the control printed circuit board 180 (180' and 180'') may be disposed as electrically connected to the source printed circuit board 140 (140' and 140") through the flexible cable 170 (170' and 170"). The control printed circuit board 180 (180' and 180") may supply the driver ICs with timing signals, power signals, etc., for controlling the driver ICs such as a gate driver and a data driver. For example, in the control printed circuit board 180 (180' and 180"), IC chips such as a timing controller and a power controller may be mounted. The timing controller and a power controller generate gate control signals such as a gate start pulse, a gate shift clock, and a gate output enable signal and data control signals such as a source start pulse, a source sampling clock, and a source output enable signal.

The back cover 110 (110' and 110") is disposed on rear surfaces of the display panel 120 (120' and 120"), the flexible film 130 (130' and 130"), and the source printed circuit board 140 (140' and 140"). The back cover 110 (110' and 110") supports the display panel 120 (120' and 120"), the flexible film 130 (130' and 130"), and the source printed circuit board 140 (140' and 140"). Thus, the back cover 110 (110' and 110") may be larger in size than the display panel 120 (120' and 120"). Therefore, the back cover 110 (110' and 110") can protect the other components of the display unit DP' and DP" against the external environment. The back cover 110 (110' and 110") may be formed of a rigid material, but at least a part of the back cover 110 (110' and 110") may have flexibility so as to be wound or unwound along with the display panel 120 (120' and 120"). For example, the back cover 110 (110' and 110") may be formed of a metal material such as Steel Use Stainless (SUS) or Invar, or plastic. However, the material of the back cover 110 (110' and 110") is not limited thereto. The material of the back cover 110 (110' and 110") may be changed variously depending on the design as long as it can satisfy property requirements such as the amount of thermal deformation, a radius of curvature, rigidity, etc.

Referring to FIG. 5, the display panel 120 (120' and 120") may include a substrate 121, a buffer layer 122, an emissive layer including a plurality of organic light emitting diodes, which may be referred to herein as a "pixel unit" 123, an encapsulation layer 124, and an encapsulation substrate 125.

The substrate 121 serves as a base member to support various components of the display panel 120 (120' and 120") and may be formed of an insulating material. The substrate 121 may be formed of a flexible material in order for the display panel 120 (120' and 120") to be wound or unwound. For example, the substrate 121 may be formed of a plastic material such as polyimide (PI).

The buffer layer 122 may suppress diffusion of moisture and/or oxygen permeating from the outside of the substrate 121. The buffer layer 122 may be formed as a single layer or a multi-layer of silicon oxide (SiOx) and silicon nitride (SiNx), but is not limited thereto.

The pixel unit 123 includes a plurality of organic light emitting elements and circuits for driving the organic light emitting elements. The pixel unit 123 may correspond to the active area AA. Each organic light emitting element may include an anode, an organic emission layer, and a cathode.

The anode may supply holes into the organic emission layer and may be formed of a conductive material having a high work function. For example, the anode may be formed of tin oxide (TO), indium tin oxide (ITO), indium zinc oxide (IZO), indium zinc tin oxide (ITZO), or the like, but is not limited thereto.

The organic emission layer may receive holes from the anode and electrons from the cathode and emit light. The organic emission layer may be one of a red organic emission layer, a green organic emission layer, a blue organic emission layer, and a white organic emission layer depending on the color of light emitted from the organic emission layer. If the organic emission layer is a white organic emission layer, color filters of various colors may be further provided.

The cathode may supply electrons into the organic emission layer and may be formed of a conductive material having a low work function. For example, the cathode may be formed of one or more materials selected from the group consisting of metals such as magnesium (Mg), silver (Ag), and aluminum (Al) and alloys thereof, but is not limited thereto.

The display panel 120 (120' and 120") may be classified into a top emission type or a bottom emission type according to a transmission direction of light emitted from the organic light emitting element.

In the top emission type, light emitted from the organic light emitting element is discharged toward the upper side of the substrate 121 on which the organic light emitting element is formed. If the display panel 120 (120' and 120") is of top emission type, a reflective layer may be further provided under the anode. This is to discharge light emitted from the organic light emitting element toward the upper side of the substrate 121, i.e., toward the cathode.

In the bottom emission type, light emitted from the organic light emitting element is discharged toward the lower side of the substrate 121 on which the organic light emitting element is formed. If the display panel 120 (120' and 120") is of bottom emission type, the anode may be formed of a transparent conductive material only and the cathode may be formed of a metal material having high reflectivity. This is to discharge light emitted from the organic light emitting element toward the lower side of the substrate 121.

Hereafter, for the convenience of description, the display device 100 according to an embodiment of the present disclosure will be described as a bottom emission type display device, but is not limited thereto.

In the pixel unit 123, a circuit for driving organic light emitting elements may be disposed. The circuit may be composed of a TFT, a storage capacitor, a gate line, a data line, a power line, etc. The components of the circuit may be changed variously depending on the design of the display device 100.

The encapsulation layer 124 covering the pixel unit 123 may be disposed on the pixel unit 123. The encapsulation layer 124 seals the organic light emitting elements of the pixel unit 123. The encapsulation layer 124 may protect the organic light emitting elements of the pixel unit 123 against external moisture, oxygen, and impacts. The encapsulation layer 124 may be formed by alternately laminating a plurality of inorganic layers and a plurality of organic layers. For example, the inorganic layers may be formed of inorganic materials such as silicon nitride (SiNx), silicon oxide (SiOx), and aluminum oxide (AlOx), but are not limited thereto. For example, the organic layers may be formed of epoxy-based or acryl-based polymers, but are not limited thereto.

The encapsulation substrate 125 may be disposed on the encapsulation layer 124. The encapsulation substrate 125 protects the organic light emitting elements of the pixel unit 123 together with the encapsulation layer 124. The encapsulation substrate 125 may protect the organic light emitting elements of the pixel unit 123 against external moisture, oxygen, and impacts. The encapsulation substrate 125 may be formed of a metal material which has high corrosion resistance and can be easily processed into foil or thin film. Examples of the metal material may include aluminum (Al), nickel (Ni), chromium (Cr), and an alloy of iron (Fe) and Ni. Since the encapsulation substrate 125 is formed of a metal material, the encapsulation substrate 125 can be implemented in the form of an ultra-thin film and can provide high resistance to external impacts and scratches.

A first adhesive layer AD1 may be disposed between the encapsulation layer 124 and the encapsulation substrate 125. The first adhesive layer AD1 may bond the encapsulation layer 124 to the encapsulation substrate 125. The first adhesive layer AD1 may be formed of an adhesive material and may be a thermosetting or naturally-curable adhesive. For example, the first adhesive layer AD1 may be formed of an optical clear adhesive (OCA), a pressure sensitive adhesive (PSA), or the like, but is not limited thereto.

The first adhesive layer AD1 may be disposed to cover the encapsulation layer 124 and the pixel unit 123. That is, the pixel unit 123 may be sealed by the buffer layer 122 and the encapsulation layer 124, and the encapsulation layer 124 and the pixel unit 123 may be sealed by the buffer layer 122 and the first adhesive layer AD1. The first adhesive layer AD1 may protect the organic light emitting elements of the pixel unit 123 against external moisture, oxygen, and impacts together with the encapsulation layer 124 and the encapsulation substrate 125. Herein, the first adhesive layer AD1 may further contain a moisture absorbent. The moisture absorbent may include hygroscopic particles and may absorb moisture and oxygen from the outside to minimize permeation of moisture and oxygen into the pixel unit 123.

The back cover 110 (110' and 110") is disposed on the encapsulation substrate 125. The back cover 110 (110' and 110") may be disposed to be in contact with the encapsulation substrate 125 of the display panel 120 (120' and 120") to protect the display panel 120 (120' and 120"). The back cover 110 (110' and 110") may be formed of a rigid material to protect the display panel 120 (120' and 120").

The back cover 110 (110' and 110") includes a plurality of openings 111. The plurality of openings 111 enables the back cover 110 (110' and 110") to have flexibility. The plurality of openings 111 may be flexibly deformed and enables the back cover 110 (110' and 110") to be wound around or unwound from the rolling unit 190 along with the display panel 120 (120' and 120").

A second adhesive layer AD2 (AD2' and AD2") may be disposed between the encapsulation substrate 125 of the display panel 120 (120' and 120") and the back cover 110 (110' and 110"). The second adhesive layer AD2 (AD2' and AD2") may bond the encapsulation substrate 125 and the back cover 110 (110' and 110"). The second adhesive layer AD2 (AD2' and AD2") may be formed of an adhesive material and may be a thermosetting or naturally-curable adhesive. For example, the second adhesive layer AD2 (AD2' and AD2") may be formed of an optical clear adhesive (OCA), a pressure sensitive adhesive (PSA), or the like, but is not limited thereto.

FIG. 5 illustrates that the plurality of openings 111 of the back cover 110 (110' and 110") is not filled with the second adhesive layer AD2 (AD2' and AD2"). However, some or all of the plurality of openings 111 of the back cover 110 (110' and 110") may be filled with the second adhesive layer AD2 (AD2' and AD2"). When the second adhesive layer AD2 (AD2' and AD2") fills in the plurality of openings 111 of the back cover 110 (110' and 110"), a contact area between the second adhesive layer AD2 (AD2' and AD2") and the back cover 110 (110' and 110") increases. Thus, it is possible to suppress separation therebetween.

Although not illustrated in FIG. 5, a transparent film may be further disposed on a rear surface of the substrate 121. The transparent film may function to protect a front surface of the display panel 120 (120' and 120") or minimize reflection of external light incident into the display panel 120 (120' and 120"). For example, the transparent film may be at least one of a polyethyleneterephthalate (PET) film, a cyclo olefin polymer (COP) film, an anti-reflection film, a polarizing film, and a transmittance controllable film, but is not limited thereto.

Hereafter, the rolling unit 190 will be described in more detail with reference to FIG. 3.

Detailed Configuration of Rolling Unit

Referring to FIG. 3, the rolling unit 190 of the display device 100 according to an embodiment of the present disclosure may include a central or core portion thereof, which may be referred to as a "fastening unit" 191, in which an end portion of each of the display units DP' and DP" is inserted. The rolling unit 190 also includes a body 192 which is fastened to the fastening unit 191 in a state where the control printed circuit boards 180' and 180" are inserted. The fastening unit 191 and the body 192 may be formed as a bilaterally symmetric pair, but are not limited thereto. Further, a pair of the fastening unit 191 and the body 192 may have a cylindrical shape whose cross section is a circular shape, but is not limited thereto.

The pad portion or non-pad portion of the non-active area NA of the tiled display units DP' and DP" may be inserted in the fastening unit 191. Also, the flexible film 130 (130' and 130") electrically connected to the display panel 120 (120' and 120"), the entire source printed circuit board 140 (140' and 140"), and a part of the flexible cable 170 (170' and 170") may be inserted in the fastening unit 191.

The body 192 may have a half-cylindrical shape whose cross section is a semi-circular shape, but is not limited thereto. Another part of the flexible cable 170 (170' and 170") and the entireties of the control printed circuit boards 180' and 180" may be inserted in the body 192, but the present disclosure is not limited thereto. The body 192 may be hinged to the fastening unit 191, but the present disclosure is not limited thereto.

The rolling unit 190 may further include a pressing member 193 for fastening the body 192 to the fastening unit 191 or winding or unwinding the display unit DP' and DP". The pressing member 193 may include an additional fastening member for fastening the body 192 to the fastening unit 191, but is not limited thereto.

In the display device 100 according to an embodiment of the present disclosure, the large-area display unit DP' and DP" can be implemented without a decrease in yield by tiling two or more display units DP' and DP" and the size of the rolling unit 190 can be reduced.

As shown in FIG. 3, according to an embodiment of the present disclosure, the pad portion or non-pad portion of the non-active area NA of the tiled display units DP' and DP" is inserted in the fastening unit 191. Thus, only the active area AA can be seen on the light emission surface. Therefore, the bezel of the large-area display unit DP' and DP" can be removed, and, thus, aesthetics of the display device can be improved.

Hereafter, the back cover 110 will be described in more detail with reference to FIG. 6A and FIG. 6B.

Detailed Configuration of Back Cover

Figure 6A:
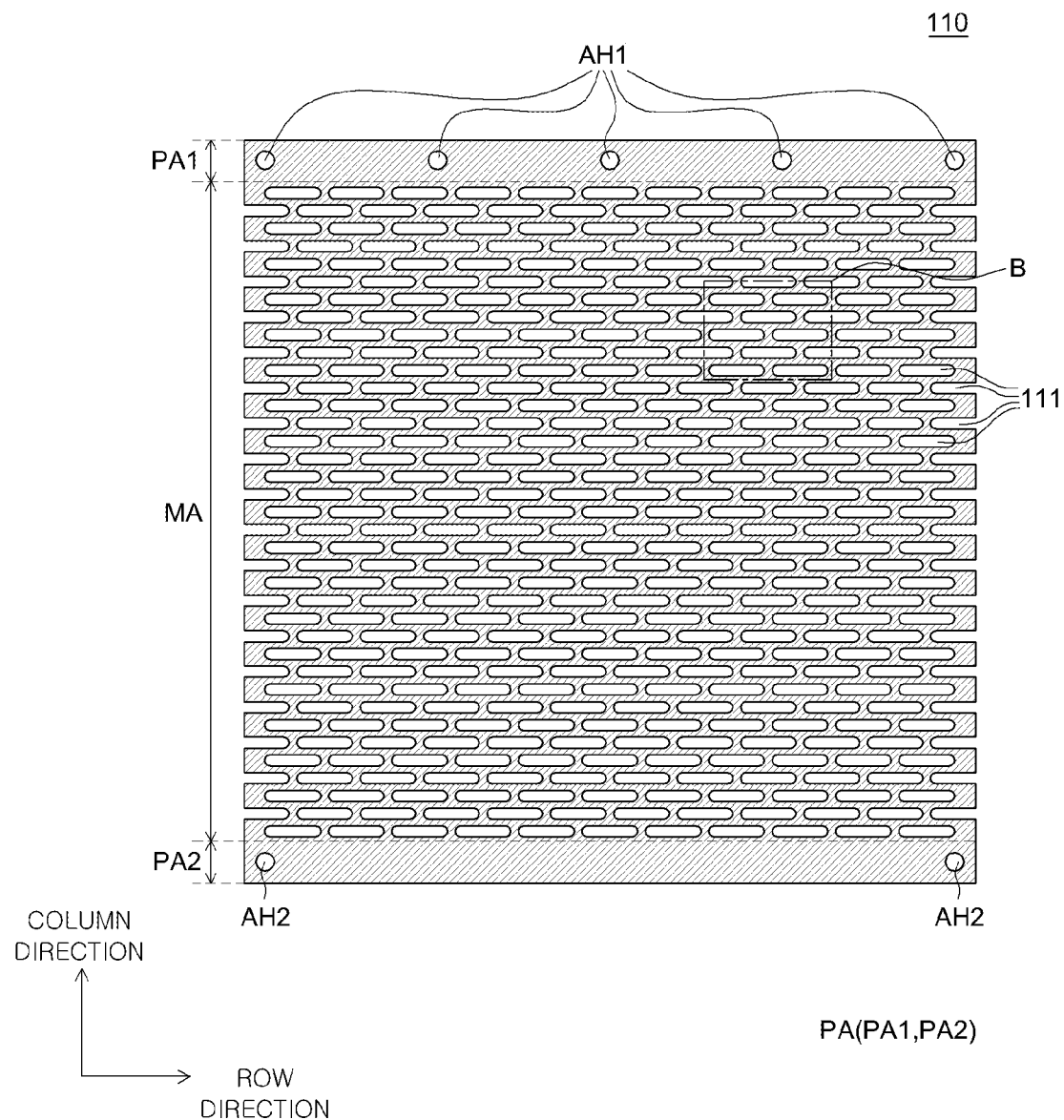
FIG. 6A is a plan view of a back cover of the display device according to an embodiment of the present disclosure.

FIG. 6A is a plan view of a back cover of the display device according to an embodiment of the present disclosure. FIG. 6B is an enlarged view of a region "B" of FIG. 6A. FIG. 6A and FIG. 6B illustrate only the back cover 110 illustrated in FIG. 4 and FIG. 5.

Figure 6B:
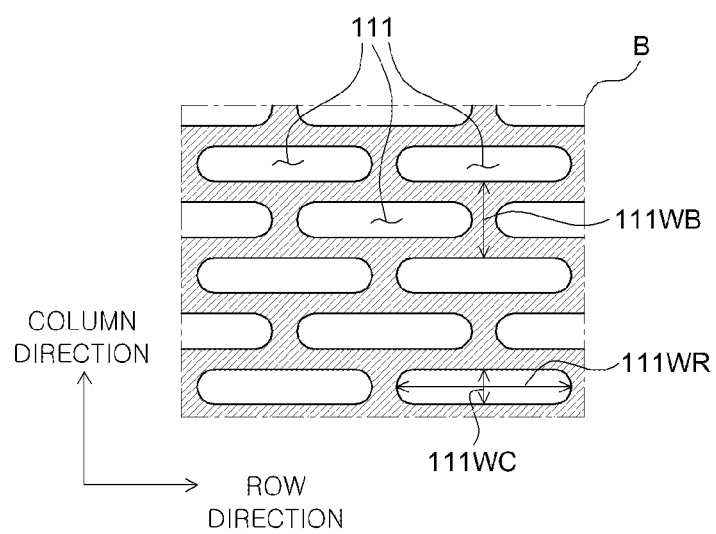
FIG. 6B is an enlarged view of a region "B" of FIG. 6A.

Referring to FIG. 6A and FIG. 6B, the back cover 110 may include a supporting area PA and a flexible area MA. For example, the back cover 110 may include a first supporting area PA1 on the uppermost end of the back cover 110, a second supporting area PA2 on the lowermost end of the back cover 110, and a flexible area MA between the first supporting area PA1 and the second supporting area PA2.

The first supporting area PA1 of the back cover 110 is the uppermost area of the back cover 110 and fastened to a vertically-extending, generally cylindrical support roller, which may be referred to herein as a "vertical supporting unit." The first supporting area PA1 may include first alignment holes AH1 so as to be fastened to the vertical supporting unit. Further, screws penetrating the vertical supporting unit and the first alignment holes AH1 may be provided to fasten the vertical supporting unit to the first supporting area PA1 of the back cover 110. Since the first supporting area PA1 is fastened to the vertical supporting unit, the back cover 110 can be rolled inwards or outwards at the same time when the vertical supporting unit is rolled (or rotated). The display panel 120 attached to the back cover 110 can also be rolled inwards or outwards. FIG. 6A illustrates five first alignment holes AH1, but the number of first alignment holes AH1 is not limited thereto. Further, FIG. 6A illustrates that the back cover 110 is fastened to the vertical supporting unit using the first alignment holes AH1. However, the present disclosure is not limited thereto. The back cover 110 may be fastened to the vertical supporting unit without alignment holes. Details of the vertical supporting unit will be described later with reference to FIG. 7 through FIG. 10.

The second supporting area PA2 of the back cover 110 is the lowermost area of the back cover 110 and fastened to the rolling unit 190. The second supporting area PA2 may include second alignment holes AH2 so as to be fastened to the rolling unit 190. Further, screws penetrating the rolling unit 190 and the second alignment holes AH2 may be provided to fasten the rolling unit 190 to the second supporting area PA2 of the back cover 110. Since the second supporting area PA2 is fastened to the rolling unit 190, the back cover 110 can be wound around or unwound from the rolling unit 190 by rotation of the rolling unit 190. FIG. 6A illustrates two second alignment holes AH2, but the number of second alignment holes AH2 is not limited thereto. Further, FIG. 6A illustrates that the back cover 110 is fastened to the rolling unit 190 using the second alignment holes AH2. However, the present disclosure is not limited thereto. The back cover 110 may be fastened to the rolling unit 190 and the vertical supporting unit without alignment holes.

The flexible area MA of the back cover 110 is wound around or unwound from the rolling unit 190 along with the display panel 120. The flexible area MA may overlap at least the display panel 120 among the other components of the display unit DP' and DP".

The plurality of openings 111 may be disposed in the flexible area MA of the back cover 110. During winding or unwinding of the display unit DP' and DP", the plurality of openings 111 may be deformed by stress applied to the display unit DP' and DP". That is, during winding or unwinding of the display unit DP' and DP", the flexible area MA of the back cover 110 may be deformed as the plurality of openings 111 contracts or expands. Further, since the plurality of openings 111 contracts or expands, a slip phenomenon of the display panel 120 disposed on the flexible area MA of the back cover 110 can be minimized. Therefore, stress applied to the display panel 120 can be minimized.

During winding of the display panel 120 and the back cover 110, there is a difference in length between the display panel 120 and the back cover 110 which are wound around the rolling unit 190. This is because there is a difference in radius of curvature between the display panel 120 and the back cover 110. For example, when the back cover 110 and the display panel 120 are wound around the rolling unit 190, the back cover 110 and the display panel 120 may need different lengths to be wound once around the rolling unit 190. That is, the display panel 120 is disposed farther from the rolling unit 190 than the back cover 110, and, thus, the display panel 120 may need a larger length to be wound once around the rolling unit 190 than the back cover 110. As such, a difference in radius of curvature during winding of the display unit DP' and DP" causes a difference in length for winding of the back cover 110 and the display panel 120. Thus, the display panel 120 attached to the back cover 110 may slip and move from its original position. In this case, a phenomenon that the display panel 120 slips from the back cover 110 due to differences in stress and radius of curvature caused by winding may be defined as slip phenomenon. If slip occurs excessively, the display panel 120 may be detached from the back cover 110 or defects such as cracks may occur.

In the display device 100 according to an embodiment of the present disclosure, even when the display unit DP' and DP" is applied with stress by being wound or unwound, the plurality of openings 111 of the back cover 110 may be flexibly deformed to reduce stress applied to the back cover 110 and the display panel 120.

Referring to FIG. 6A and FIG. 6B, the plurality of openings 111 is misaligned with the plurality of openings 111 of adjacent rows. For example, the plurality of openings 111 of one row is misaligned with the plurality of openings 111 of rows adjacent to the row. Specifically, the centers of the plurality of openings 111 in odd-numbered rows may be misaligned with the centers of the plurality of openings 111 in even-numbered rows by as much as, e.g., ½ of a row-direction width 111WR of each opening 111, or, e.g., ½ of the sum of the row-direction width 111WR and a row-direction width of a gap between adjacent openings 111. The placement of the plurality of openings 111 shown in FIG. 6A is just an example, but is not limited thereto.

Since adjacent rows of the plurality of openings 111 are mis-aligned with each other, a distance 111WB between aligned openings 111 in the column direction can be minimized. Specifically, in the flexible area MA, a distance between aligned openings 111 in the column direction may have rigidity. Further, during winding of the back cover 110, the back cover 110 needs to be bent in the column direction. Thus, as the length 111WB of the partial area between the aligned openings 111 in the column direction increases, it may become more difficult for the back cover 110 to be bent in the column direction. Since the plurality of openings 111 is misaligned by row, the distance 111WB between the aligned openings 111 in the column direction can be minimized, compared to a case where the openings 111 are not misaligned by row. Also, the area between the plurality of openings 111 can be minimized. The distance 111WB between the aligned openings 111 in the column direction is minimized and the flexible area MA is extended continuously in the column direction to remove the area where the plurality of openings 111 is not disposed. Thus, the length 111WB of the area between the plurality of openings 111 having rigidity in the column direction can be minimized.

Therefore, the rigidity of the back cover 110 can be improved without interrupting winding or unwinding of the back cover 110.

Referring to FIG. 6B, the plurality of openings 111 has the row-direction maximum width 111WR which is larger than a column-direction maximum width 111WC. That is, as shown in FIG. 6B, the maximum width 111WR of the plurality of openings 111 in a transverse direction may be larger than the maximum width 111WC of the plurality of openings 111 in a vertical direction. As the row-direction width 111WR of the plurality of openings 111 increases, it may become easier for the flexible area MA of the back cover 110 to be flexibly deformed. Specifically, during winding of the back cover 110, the back cover 110 may be bent in the column direction and stress may be applied to expand the plurality of openings 111 in the column direction. In this case, if the row-direction width 111WR of the plurality of openings 111 increases, when the plurality of openings 111 is stretched in the column direction, the column-direction width 111WC of the plurality of openings 111 may increase. Further, as the plurality of openings 111 expands in the column direction, stress applied to the flexible area MA may be reduced. Therefore, by increasing the row-direction width 111WR of the plurality of openings 111, the flexible area MA of the back cover 110 can be easily wound or unwound and stress applied to the flexible area MA can be reduced.

As the column-direction width 111WC of the plurality of openings 111 increases, it becomes easier to process the plurality of openings 111. However, when the column-direction width 111WC of the plurality of openings 111 increases, the aperture ratio of the plurality of openings 111 in the flexible area MA increases. Also, a contact area between the display panel 120 and the back cover 110 which are attached to the flexible area MA decreases. In this case, if an overlap area between the display panel 120 and the back cover 110, i.e., a contact area between the back cover 110 and the second adhesive layer AD2, decreases, the back cover 110 may be separated from the second adhesive layer AD2. Therefore, the column-direction width 111WC of the plurality of openings 111 may be controlled to control adhesive strength between the display panel 120 and the back cover 110 in order to suppress separation therebetween. Further, the row-direction width 111WR of the plurality of openings 111 may be controlled such that the back cover 110 can have high flexibility.

In this case, the plurality of openings 111 formed in the flexible area MA is not formed in the first supporting area PA1 and the second supporting area PA2. That is, only the first alignment holes AH1 and the second alignment holes AH2 are formed in each of the first supporting area PA1 and the second supporting area PA2. However, the plurality of openings 111 formed in the flexible area MA is not formed in the first supporting area PA1 and the second supporting area PA2. Further, the first alignment holes AH1 and the second alignment holes AH2 are different in shape from the plurality of openings 111. The first supporting area PA1 and the second supporting area PA2 are fixed to the vertical supporting unit and the rolling unit 190, respectively, and need to have higher rigidity than the flexible area MA. Specifically, the first supporting area PA1 and the second supporting area PA2 have rigidity. Thus, the first supporting area PA1 and the second supporting area PA2 can be securely fixed to the vertical supporting unit and the rolling unit 190, respectively.

In the display device 100 according to an embodiment of the present disclosure, the back cover 110 including the plurality of openings 111 is disposed on the rear surface of the display panel 120 to support and protect the display panel 120. The back cover 110 may be formed of a metal material and thus may have rigidity. Also, the flexible area MA of the back cover 110 in which the display panel 120 is disposed includes the plurality of openings 111, and, thus, the back cover 110 may have improved flexibility. Therefore, in the full unwinding state of the display unit DP' and DP'' of the display device 100, the back cover 110 formed of a rigid material and having high rigidity may support the display panel 120 to be spread flat. In the full winding state of the display unit DP' and DP'' of the display device 100, the back cover 110 having high flexibility due to the plurality of openings 111 may be wound around the rolling unit 190 and housed together with the display panel 120.

Further, in the display device 100 according to an embodiment of the present disclosure, the row-direction width 111WR of the plurality of openings 111 may be controlled such that the back cover 110 can have flexibility. Further, stress applied to the back cover 110 during winding can be reduced. That is, during winding of the back cover 110 and the display panel 120 around the rolling unit 190, the back cover 110 may be bent in the column direction and stress may be applied to expand the plurality of openings 111 in the column direction. Since the plurality of openings 111 has a large row-direction width 111WR, the plurality of openings 111 can easily expand in the column direction during winding of the back cover 110 and the display panel 120 around the rolling unit 190. Also, stress applied to the back cover 110 can be reduced. Therefore, in the display device 100 according to an embodiment of the present disclosure, by controlling the row-direction width 111WR of the plurality of openings 111, the flexibility of the back cover 110 can be improved. Thus, the back cover 110 and the display panel 120 can be easily wound around the rolling unit 190. Further, since the plurality of openings 111 can reduce stress applied to the back cover 110 and the display panel 120 while expanding in the column direction, damage to the display panel 120 can be suppressed.

Furthermore, in the display device 100 according to an embodiment of the present disclosure, the column-direction width 111WC of the plurality of openings 111 may be controlled to control adhesive strength between the back cover 110 and the display panel 120. Specifically, the display panel 120 is attached to the flexible area MA of the back cover 110. In this case, as the aperture ratio of the plurality of openings 111 in the flexible area MA increases, a contact area between the display panel 120 and the back cover 110 decreases. Thus, the adhesive strength between the display panel 120 and the back cover 110 may decrease. However, in the display device 100 according to an embodiment of the present disclosure, the plurality of openings 111 in the back cover 110 has a small column-direction width 111WC. Thus, the aperture ratio of the plurality of openings 111 can be reduced and the contact area between the display panel 120 and the back cover 110 can be increased. As the contact area between the display panel 120 and the back cover 110 increases, the adhesive strength between the display panel 120 and the back cover 110 can be improved. Therefore, in the display device 100 according to an embodiment of the present disclosure, by controlling the column-direction width 111WC of the plurality of openings 111, the adhesive strength between the back cover 110 and the display panel 120 can be maintained at a certain level or more to suppress separation therebetween.

Supporting Structure for Display Unit

Figure 7:
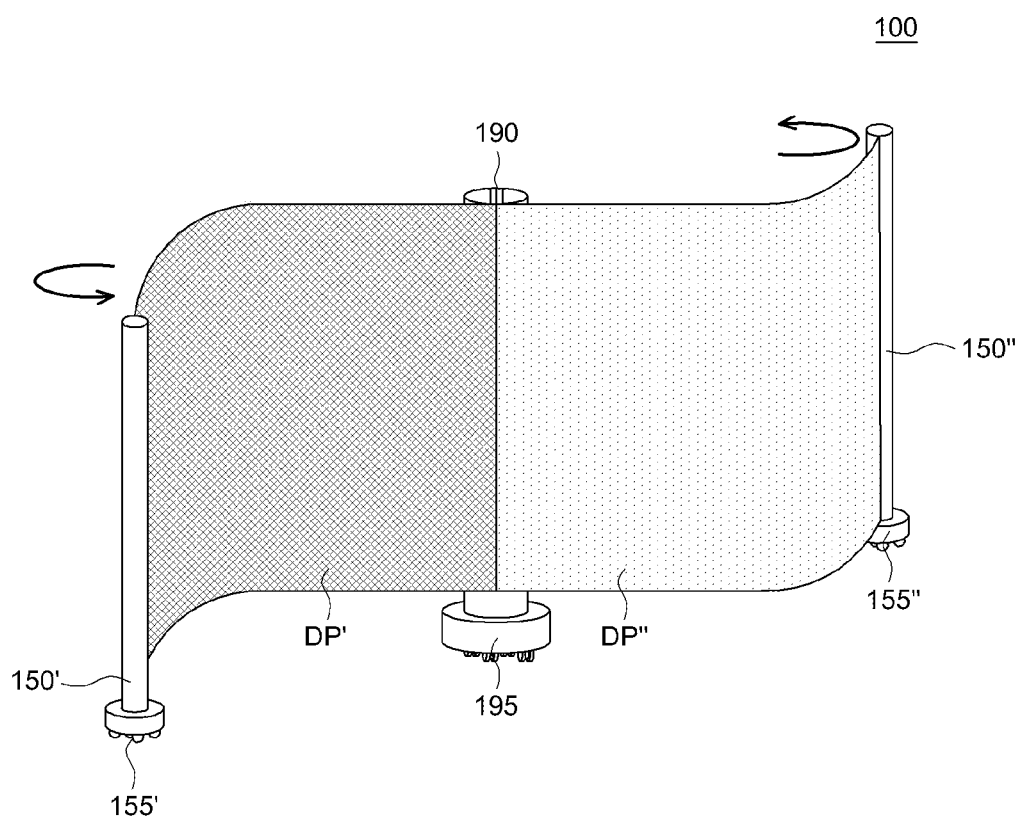
FIG. 7 is a perspective view of the display device according to an embodiment of the present disclosure.
Figure 8:
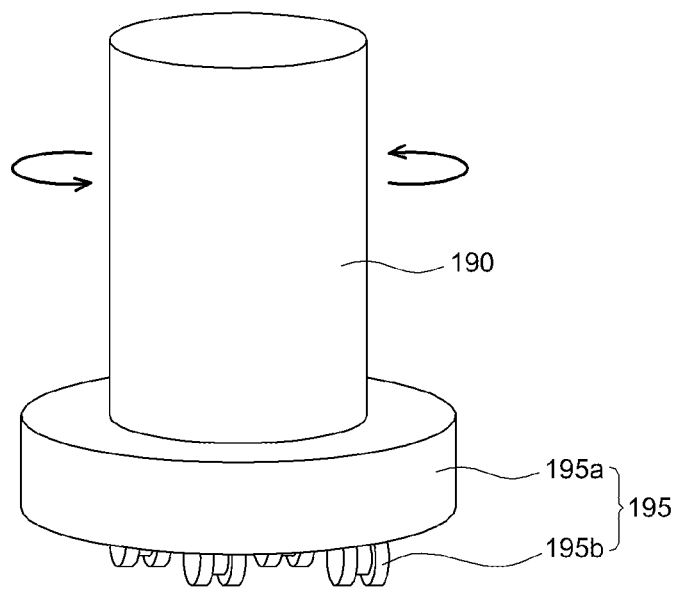
FIG. 8 is an enlarged view of a rolling unit of the display device according to an embodiment of the present disclosure.
Figure 9A:
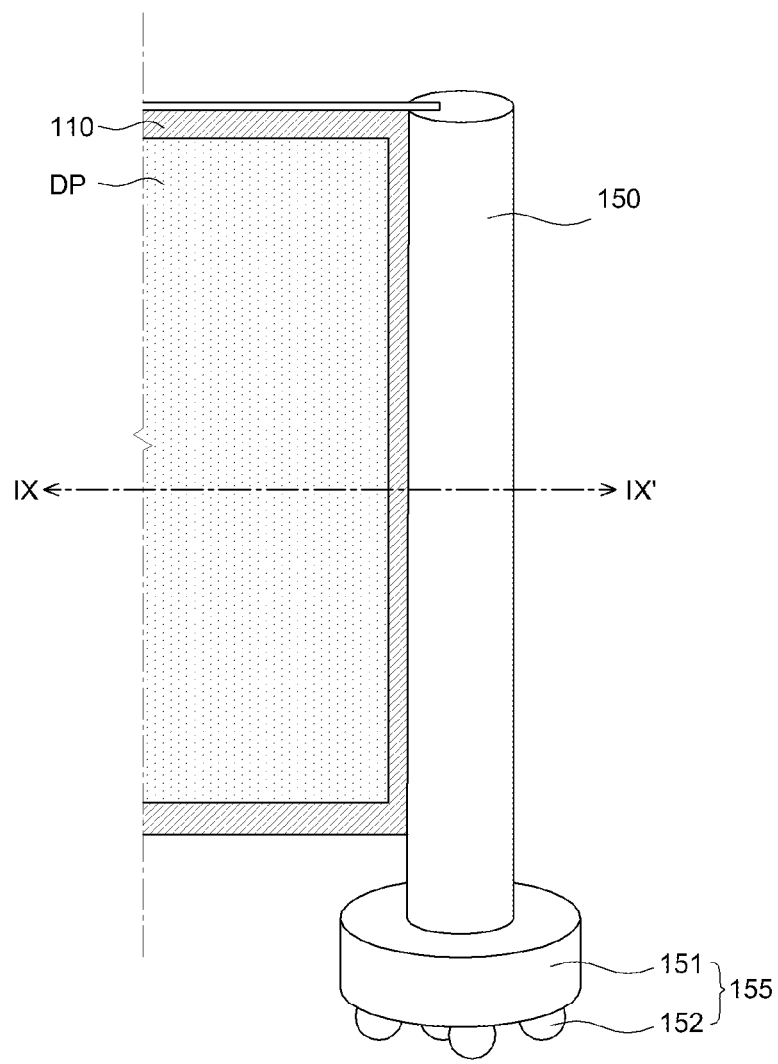
FIG. 9A is an enlarged view of a vertical supporting unit of the display device according to an embodiment of the present disclosure.
Figure 9B:
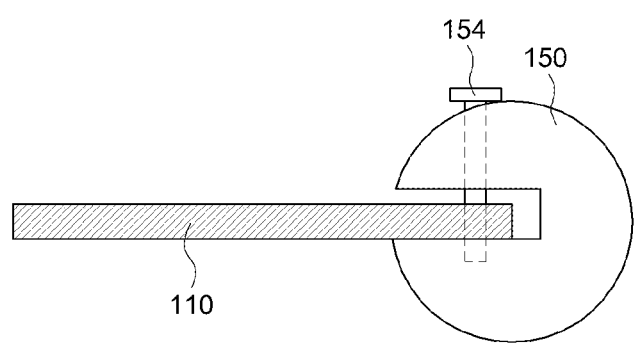
FIG. 9B is a cross-sectional view as taken along a line IX-IX' of FIG. 9A.
Figure 10:
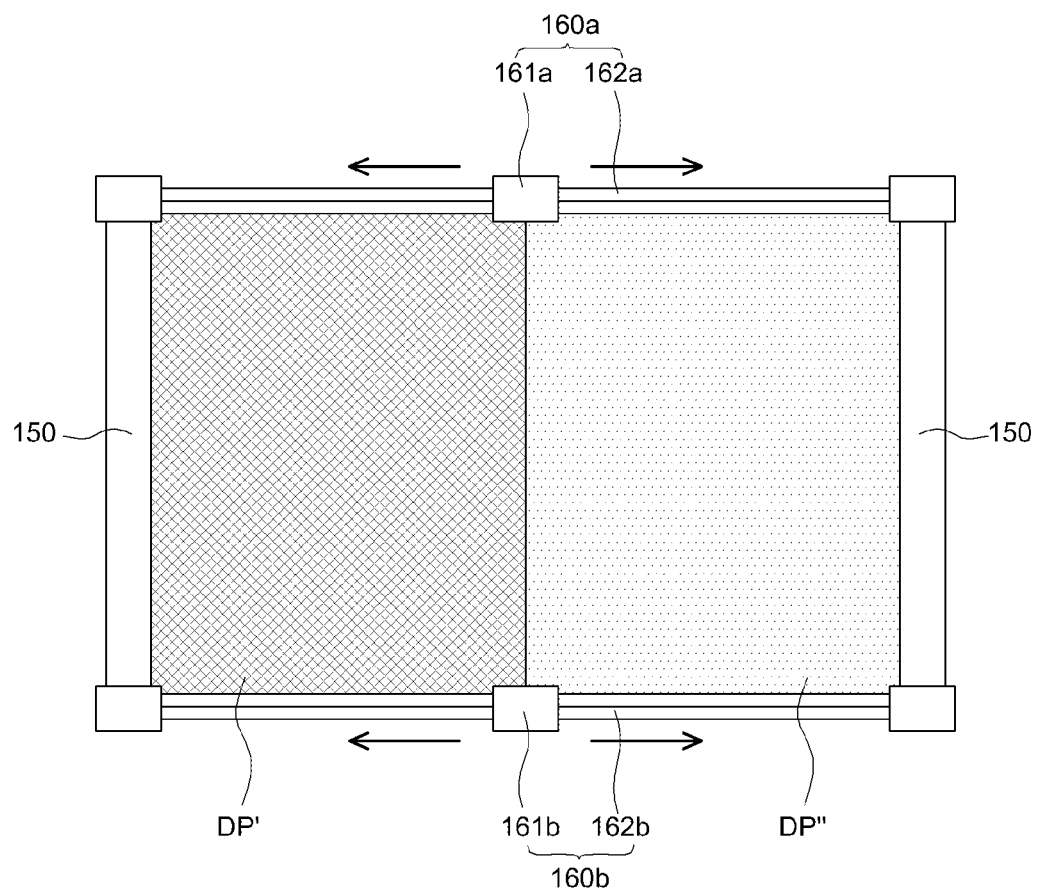
FIG. 10 is a plan view provided to explain a horizontal supporting unit of the display device according to an embodiment of the present disclosure.

FIG. 7 is a perspective view of the display device according to an embodiment of the present disclosure. FIG. 8 is an enlarged view of a rolling unit of the display device according to an embodiment of the present disclosure. FIG. 9A is an enlarged view of a vertical supporting unit of the display device according to an embodiment of the present disclosure. FIG. 9B is a cross-sectional view as taken along a line IX-IX' of FIG. 9A. FIG. 10 is a plan view provided to explain a horizontal supporting unit of the display device according to an embodiment of the present disclosure. The components relevant to a vertical supporting unit 150 illustrated in FIG. 9A and FIG. 9B can be applied to both vertical supporting units 150' and 150" connected to ends of the left and right display units DP' and DP". For the convenience of description, symbols ' and " are omitted from reference numerals. For the convenience of description, FIG. 9B does not illustrate the configuration of the display panel 120.

Referring to FIG. 7 and FIG. 8, the rolling unit 190 is configured to house and fasten thereto the pad portion or non-pad portion of the non-active area NA of the display unit DP' and DP". Each display unit DP' and DP" may be housed as wound around the outer surface of the rolling unit 190 by inward and/or outward rolling, but is not limited thereto. Thus, the rolling unit 190 may have a cylindrical shape that enables each display unit DP' and DP" to be housed as wound around the outer surface of the rolling unit 190 by inward and/or outward rolling, but is not limited thereto.

The rolling unit 190 may include a wheeled base portion thereof, which may be referred to as a "moving unit" 195, at a lower end thereof. The moving unit 195 is configured to move the display device 100 and roll or fix the display unit DP' and DP". The rolling unit 190 and the moving unit 195 may be rotated together. However, the present disclosure is not limited thereto. Each of the rolling unit 190 and the moving unit 195 may be rotated individually.

The moving unit 195 may include a body 195a to be fastened to the rolling unit 190 and a moving member 195b, such as a wheel or roller, under the body 195a. FIG. 8 illustrates four moving members 195b, but the number of moving members 195b is not limited thereto. The moving member 195b can be moved during rolling of the display unit DP' and DP" and can be fixed when images are displayed on the display panel 120.

The body 195a of the moving unit 195 may have a cylindrical shape like the rolling unit 190, but is not limited thereto. If the body 195a of the moving unit 195 has a cylindrical shape, it may have a larger diameter than the rolling unit 190.

Referring to FIG. 7, FIG. 9A and FIG. 9B, the display device 100 according to an embodiment of the present disclosure may further include the vertical supporting unit 150 (150' and 150") to fix a side surface of the display unit DP' and DP". Further, the vertical supporting unit 150 (150' and 150") may assist rolling of display unit DP' and DP" being rolled by the rolling unit 190 or itself may roll the display unit DP' and DP".

The vertical supporting unit 150 (150' and 150") is configured to fasten thereto the pad portion or non-pad portion of another non-active area NA of the display unit DP' and DP". Each display unit DP' and DP" may be housed as wound around the outer surface of the rolling unit 190 by inward and/or outward rolling. In this case, a side surface of each display unit DP' and DP" rolled inwards and/or outwards may be fastened to the vertical supporting unit 150 (150' and 150"). However, the present disclosure is not limited thereto. The vertical supporting unit 150 (150' and 150") itself may roll the display unit DP' and DP". In this case, each display unit DP' and DP" may be rolled inwards and/or outwards by rolling (or rotating) each vertical supporting unit 150 (150' and 150") counterclockwise when viewed from above and/or clockwise when viewed from above. Each display unit DP' and DP" may be housed as wound around the outer surface of each vertical supporting unit 150 (150' and 150").

As described above, the first supporting area PA1 of the back cover 110 is the uppermost area of the back cover 110 and fastened to the vertical supporting unit 150 (150' and 150"). The first supporting area PA1 may include the first alignment holes AH1 so as to be fastened to the vertical supporting unit 150 (150' and 150"). In this case, for example, in each display unit DP' and DP", the first supporting area PA1 of the back cover 110 may be fastened to alignment grooves of the vertical supporting unit 150 (150' and 150"). Further, in a state where the first supporting area PA1 of the back cover 110 is fastened to the alignment grooves of the vertical supporting unit 150 (150' and 150"), screws 154 may penetrate the vertical supporting unit 150 (150' and 150") and the first alignment holes AH1. Thus, the vertical supporting unit 150 (150' and 150") may be fastened to the first supporting area PA1 of the back cover 110. Since the first supporting area PA1 is fastened to the vertical supporting unit 150 (150' and 150"), the back cover 110 may be rolled inwards and/or outwards during rotation of the vertical supporting unit 150 (150' and 150"). Also, the display panel 120 attached to the back cover 110 may also be rolled inwards or outwards. Like the rolling unit 190, the vertical supporting unit 150 (150' and 150") may have a cylindrical shape for rolling of the display unit DP' and DP", but is not limited thereto.

Further, the vertical supporting unit 150 (150' and 150") may include a moving unit 155 (155' and 155") on the lower side thereof. The moving unit 155 is configured to move the display device 100 and roll or fix the display unit DP' and DP". The vertical supporting unit 150 (150' and 150") and the moving unit 155 (155' and 155") may be rotated together. However, the present disclosure is not limited thereto. Each of the vertical supporting unit 150 (150' and 150") and the moving unit 155 (155' and 155") may be rotated individually.

In this case, the moving unit 155 (155' and 155") may include a body 151 to be fastened to the vertical supporting unit 150 (150' and 150") and a moving member 152, such as a wheel or roller, under the body 151. FIG. 9A illustrates four moving members 152, but the number of moving members 152 is not limited thereto. The moving member 152 can be moved during movement or rolling of the display unit DP' and DP" and can be fixed when images are displayed on the display panel 120.

The body 151 of the moving unit 155 (155' and 155") may have a cylindrical shape like the vertical supporting unit 150 (150' and 150"), but is not limited thereto. If the body 151 of the moving unit 155 (155' and 155") has a cylindrical shape, it may have a larger diameter than the vertical supporting unit 150 (150' and 150").

Referring to FIG. 10, the display device 100 according to an embodiment of the present disclosure may further include horizontally-extending support rails, which may be referred to herein as "horizontal supporting units" 160a and 160b. The horizontal supporting units 160a and 160b are configured to fix the display unit DP' and DP" and suppress rolling of the display unit DP' and DP" in the full unwinding state of the display unit DP' and DP".

The horizontal supporting units 160a and 160b are configured to be fastened to the rolling unit 190 and the upper and lower ends of the vertical supporting unit 150 (150' and 150").

The horizontal supporting units 160a and 160b may include an upper horizontal supporting unit 160a to be fastened to the rolling unit 190 and the upper end of the vertical supporting unit 150 (150' and 150"). Further, the horizontal supporting units 160a and 160b may include a lower horizontal supporting unit 160b to be fastened to the rolling unit 190 and the lower end of the vertical supporting unit 150 (150' and 150"). However, the present disclosure is not limited thereto. The display device 100 according to an embodiment of the present disclosure may include only one of the upper horizontal supporting unit 160a and the lower horizontal supporting unit 160b.

The horizontal supporting units 160a and 160b may include a plurality of fastening members 161a and 161b fastened to the rolling unit 190 and the upper and lower ends of the vertical supporting unit 150 (150' and 150"). Further, the horizontal supporting units 160a and 160b may include a plurality of connecting members 162a and 162b connecting the plurality of fastening members 161a and 161b.

The plurality of connecting members 162a and 162b may be wound around the plurality of fastening members 161a and 161b during winding or rolling of the display unit DP' and DP". However, the present disclosure is not limited thereto. The plurality of connecting members 162a and 162b may have various configurations and may be configured as a tool capable of being increased or decreased in length as needed.

In the display device 100 according to an embodiment of the present disclosure, the large-area display device 100 can be implemented without a decrease in yield by tiling the two display units DP' and DP" and the size of the rolling unit 190 can be reduced. Further, in the display device 100 according to an embodiment of the present disclosure, the bezel of the large-area display unit DP' and DP" can be removed, and, thus, aesthetics of the display device can be improved.

In the above-described display device 100 according to an embodiment of the present disclosure, inward rolling is applied to one of the display units DP' and DP" and outward rolling is applied to the other. However, the present disclosure is not limited thereto. That is, inward rolling or outward rolling may be applied identically to the display units DP' and DP". Details thereof will be described with reference to FIG. 11, FIG. 12A and FIG. 12B.

Same Rolling Direction

Figure 11:
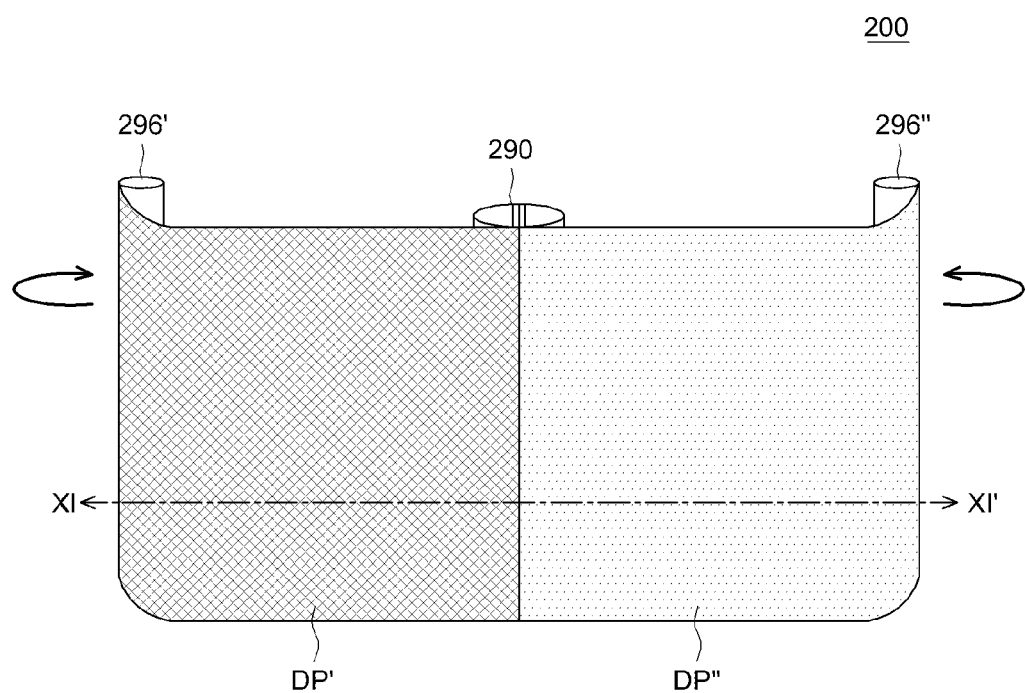
FIG. 11 is a perspective view of a display device according to another embodiment of the present disclosure.
Figure 12A:
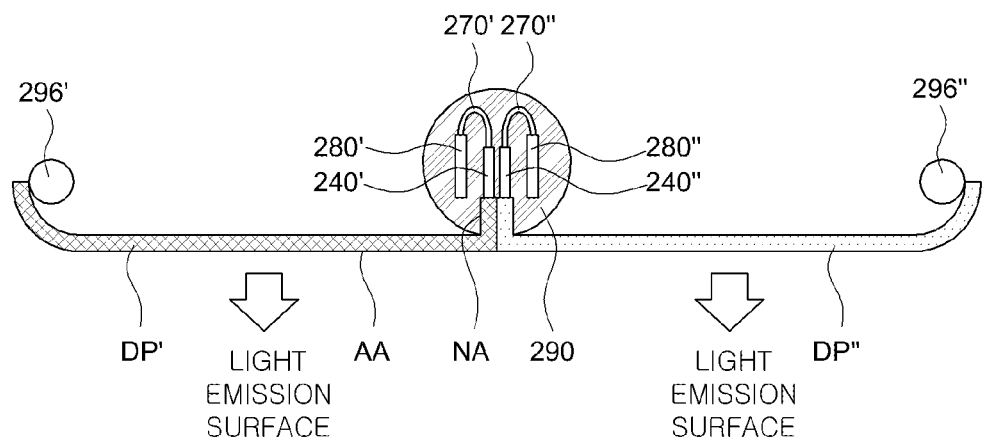
FIG. 12A is a cross-sectional view as taken along a line XI-XI' of FIG. 11.
Figure 12B:
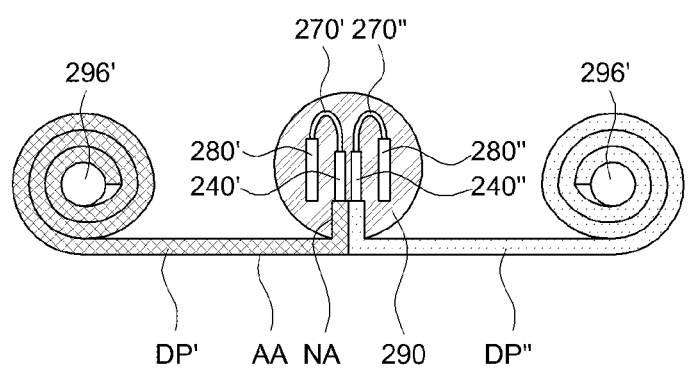
FIG. 12B is a cross-sectional view of the display device of FIG. 11 which is rolled up.

FIG. 11 is a perspective view of a display device according to another embodiment of the present disclosure. FIG. 12A is a cross-sectional view as taken along a line XI-XI' of FIG. 11. FIG. 12B is a cross-sectional view of the display device of FIG. 11 which is rolled up. A display device 200 shown in FIG. 11, FIG. 12A and FIG. 12B has substantially the same configuration as the display device 100 shown in FIG. 1 through FIG. 10 except the configuration of a rolling unit 290 and rollers 296' and 296" and a rolling direction of the display units DP' and DP". Therefore, redundant description of the same components will not be provided.

Referring to FIG. 11, FIG. 12A and FIG. 12B, the display device 200 according to another embodiment of the present disclosure may include the display units DP' and DP", the rolling unit 290, and the rollers 296' and 296".

In the display device 200 according to another embodiment of the present disclosure, the large-area display unit DP' and DP" can be implemented by tiling two or more display units DP' and DP" and the size of the rolling unit 290 can be reduced.

The display units DP' and DP" are configured to display images to the user. Each of the display units DP' and DP" may include a back cover, a display panel, source printed circuit boards 240' and 240", flexible cables 270' and 270", and control printed circuit boards 280' and 280".

The two or more display units DP' and DP" may be tiled to each other at a pad portion or a non-pad portion in a non-active area NA. The tiled pad portions or non-pad portions may be inserted and fastened in the rolling unit 290. As shown in FIG. 11, FIG. 12A and FIG. 12B, edge-bending can be applied to the pad portions in the non-active area NA. Also, outward rolling can be applied to both the left display unit DP' and the right display unit DP", which can be expanded infinitely. However, the present disclosure is not limited thereto, and inward rolling may be applied to both the left display unit DP' and the right display unit DP".

In the display device 200 according to another embodiment of the present disclosure as shown in FIG. 11, a single rolling unit 290 is disposed in the middle of the display device 200. However, the present disclosure is not limited thereto. In the display device 200 according to another embodiment of the present disclosure, circuit components, i.e., the source printed circuit boards 240' and 240", the flexible cables 270' and 270", and the control printed circuit boards 280' and 280", are just inserted and fixed in the rolling unit 290. Rolling of the display units DP' and DP" is implemented by the rollers 296' and 296" disposed on sides of the display units DP' and DP".

The display device 200 according to another embodiment of the present disclosure may be reduced in volume by gathering the circuit components in the rolling unit 290 in the middle of the display device 200. After the source printed circuit boards 240' and 240" are fixed, it cannot be rolled. Therefore, the rolling reliability can be secured.

The rolling unit 290 is configured to house and fasten thereto the pad portion or non-pad portion of the non-active area NA of the display unit DP' and DP".

The display units DP' and DP" may be housed as wound around outer surfaces of the rollers 296' and 296", respectively, by inward and/or outward rolling, but are not limited thereto.

The display units DP' and DP" of the display device 200 according to another embodiment of the present disclosure may transition from the full unwinding state to the full winding state or from the full winding state to the full unwinding state.

FIG. 11 and FIG. 12A illustrate the full unwinding state of the display units DP' and DP" of the display device 200. The full unwinding state refers to a state where the display units DP' and DP" of the display device 200 are unwound and fully spread.

FIG. 12B illustrates a partial winding state of the display units DP' and DP" of the display device 200. The partial winding state refers to a state where the display units DP' and DP" of the display device 200 are partially wound around the outer surfaces of the rollers 296' and 296", respectively, by inward and/or outward rolling.

The rollers 296' and 296" may include a first roller 296' onto which one side of the left display unit DP' is fastened and rolled and a second roller 296" onto which one side of the right display unit DP" is fastened and rolled.

For example, when the first roller 296' rotates in a second direction, i.e., clockwise when viewed from above, the left display unit DP' may be wound around the first roller 296' by outward rolling. Thus, a rear surface of the left display unit DP' may be brought into close contact with the outer surface of the first roller 296'. When the second roller 296" rotates in a first direction, i.e., counterclockwise when viewed from above, the right display unit DP'" may be wound around the second roller 296" by outward rolling. Thus, a rear surface of the right display unit DP'" may be brought into close contact with the outer surface of the second roller 296". However, the present disclosure is not limited thereto. When the first roller 296' rotates in the first direction, i.e., counterclockwise when viewed from above, the left display unit DP' may be wound around the first roller 296' by inward rolling. Thus, a front surface of the left display unit DP' may be brought into close contact with the outer surface of the first roller 296'. Further, when the second roller 296" rotates in the second direction, i.e., clockwise when viewed from above, the right display unit DP'" may be wound around the second roller 296" by inward rolling. Thus, a front surface of the right display unit DP'" may be brought into close contact with the outer surface of the second roller 296".

The rollers 296' and 296" may serve as the above-described vertical supporting units configured to fix the side surfaces of the display units DP' and DP'". In this case, the first supporting area of the back cover may be fastened to fastening grooves of the rollers 296' and 296". Each of the rollers 296' and 296" may further include a moving unit on the lower side thereof. The moving unit is configured to move the display device 200 and roll or fix the display unit DP' and DP'".

In the display device 200 according to another embodiment of the present disclosure, the large-area display device 200 can be implemented without a decrease in yield by tiling the two display units DP' and DP'" and the size of the rolling unit can be reduced. Further, in the display device 200 according to another embodiment of the present disclosure, a rolling direction of the two display units DP' and DP'" can be set as needed.

Circuit Components Inserted in Roller

Figure 13:
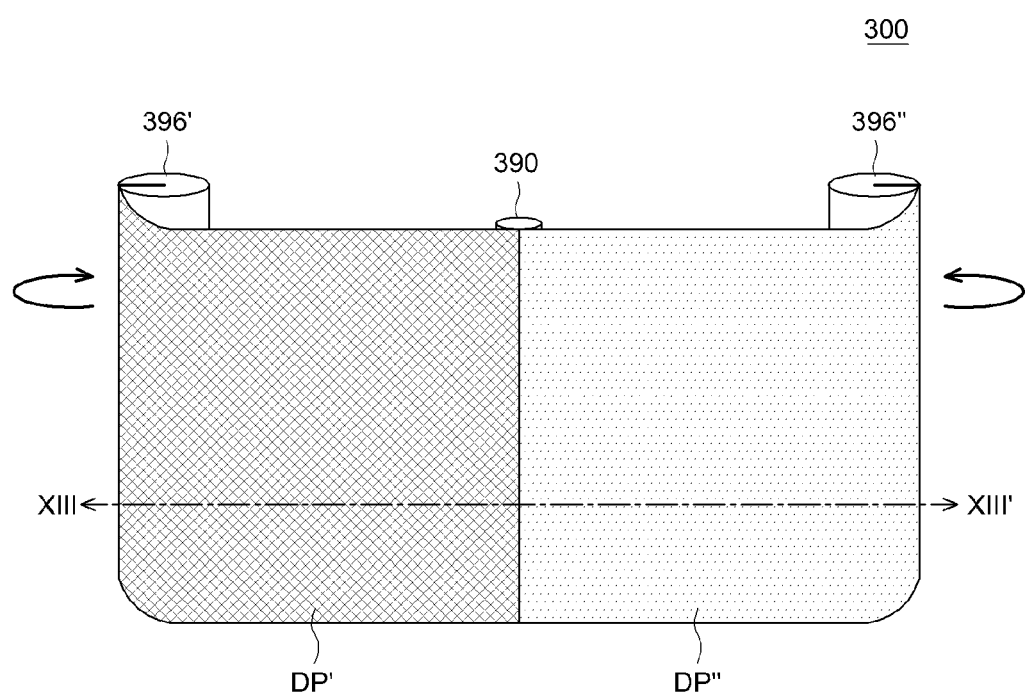
FIG. 13 is a perspective view of a display device according to yet another embodiment of the present disclosure.
Figure 14A:
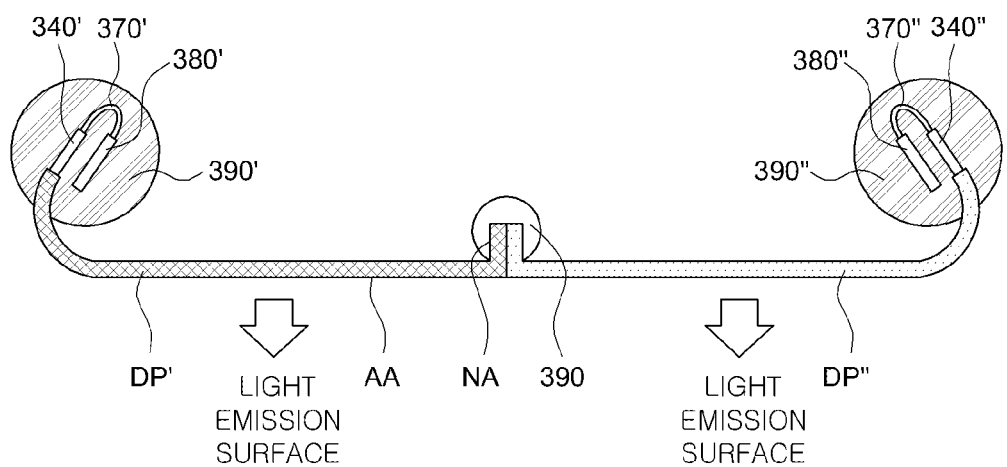
FIG. 14A is a cross-sectional view as taken along a line XIII-XIII' of FIG. 13.
Figure 14B:
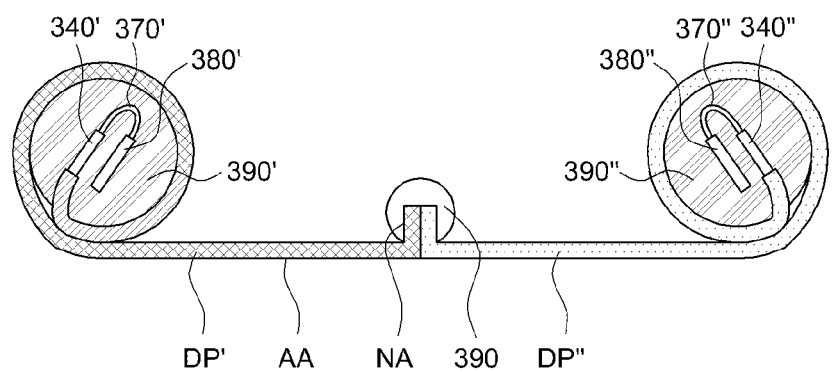
FIG. 14B is a cross-sectional view of the display device of FIG. 13 which is rolled up.

FIG. 13 is a perspective view of a display device according to yet another embodiment of the present disclosure. FIG. 14A is a cross-sectional view as taken along a line XIII-XIII' of FIG. 13. FIG. 14B is a cross-sectional view of the display device of FIG. 13 which is rolled up. A display device 300 shown in FIG. 13, FIG. 14A and FIG. 14B has substantially the same configuration as the display device 100 shown in FIG. 1 through FIG. 10 except the configuration of a rolling unit 390 and rollers 396' and 396" and an insertion position of circuit components. Therefore, redundant description of the same components will not be provided if possible.

Referring to FIG. 13, FIG. 14A and FIG. 14B, the display device 300 according to yet another embodiment of the present disclosure may include the display units DP' and DP'", the rolling unit 390, and the rollers 396' and 396".

In the display device 300 according to yet another embodiment of the present disclosure, the large-area display unit DP' and DP'" can be implemented by tiling two or more display units DP' and DP'" and the size of the rolling unit 390 can be reduced.

The display units DP' and DP'" are configured to display images to the user. Each of the display units DP' and DP'" may include a back cover, a display panel, source printed circuit boards 340' and 340'", flexible cables 370' and 370'", and control printed circuit boards 380' and 380'".

The two or more display units DP' and DP'" may be tiled to each other at a pad portion or a non-pad portion in a non-active area NA. The tiled pad portions or non-pad portions may be inserted and fastened in the rolling unit 390. As shown in FIG. 13, FIG. 14A and FIG. 14B, edge-bending can be applied to the pad portions in the non-active area NA. Also, outward rolling can be applied to both the left display unit DP' and the right display unit DP'", which can be expanded infinitely. However, the present disclosure is not limited thereto, and inward rolling may be applied to both the left display unit DP' and the right display unit DP'".

In the display device 300 according to yet another embodiment of the present disclosure as shown in FIG. 13, a single rolling unit 390 is disposed in the middle of the display device 300. However, the present disclosure is not limited thereto. In the display device 300 according to yet another embodiment of the present disclosure, circuit components, i.e., the source printed circuit boards 340' and 340'", the flexible cables 370' and 370'", and the control printed circuit boards 380' and 380'", are inserted and fixed in the rollers 396' and 396" instead of the rolling unit 390. Rolling of the display units DP' and DP'" is implemented by the rollers 396' and 396" disposed on sides of the display units DP' and DP'".

The display device 300 according to yet another embodiment of the present disclosure can be applied using the current technology. The circuit components are divided and inserted in the rollers 396' and 396" on the both sides of the display units DP' and DP'", which is advantageous in terms of heat generation.

The rolling unit 390 is configured to house and fasten thereto the pad portion or non-pad portion of the non-active area NA of the display unit DP' and DP'".

The display units DP' and DP'" may be housed as wound around outer surfaces of the rollers 396' and 396", respectively, by inward and/or outward rolling, but are not limited thereto.

The display units DP' and DP'" of the display device 300 according to yet another embodiment of the present disclosure may transition from the full unwinding state to the full winding state or from the full winding state to the full unwinding state.

FIG. 13 and FIG. 14A illustrate the full unwinding state of the display units DP' and DP'" of the display device 300. The full unwinding state refers to a state where the display units DP' and DP'" of the display device 300 are unwound and fully spread.

FIG. 14B illustrates a partial winding state of the display units DP' and DP'" of the display device 300. The partial winding state refers to a state where the display units DP' and DP'" of the display device 300 are partially wound around the outer surfaces of the rollers 396' and 396", respectively, by inward and/or outward rolling.

The rollers 396' and 396" may include a first roller 396' onto which one side of the left display unit DP' is fastened and rolled and a second roller 396" onto which one side of the right display unit DP'" is fastened and rolled.

For example, when the first roller 396' rotates in a second direction, i.e., clockwise when viewed from above, the left display unit DP' may be wound around the first roller 396' by outward rolling. Thus, a rear surface of the left display unit DP' may be brought into close contact with the outer surface of the first roller 396'. When the second roller 396" rotates in a first direction, i.e., counterclockwise when viewed from above, the right display unit DP'" may be wound around the second roller 396" by outward rolling. Thus, a rear surface of the right display unit DP'" may be brought into close contact with the outer surface of the second roller 396". However, the present disclosure is not limited thereto. When the first roller 396' rotates in the first direction, i.e., counterclockwise when viewed from above, the left display unit DP' may be wound around the first roller 396' by inward rolling. Thus, a front surface of the left display unit DP' may be brought into close contact with the outer surface of the first roller 396'. Further, when the second roller 396" rotates in the second direction, i.e., clockwise when viewed from above, the right display unit DP" may be wound around the second roller 396" by inward rolling. Thus, a front surface of the right display unit DP" may be brought into close contact with the outer surface of the second roller 396".

In the display device 300 according to yet another embodiment of the present disclosure, the large-area display device 300 can be implemented without a decrease in yield by tiling the two display units DP' and DP" and the size of the rolling unit can be reduced. Further, in the display device 300 according to yet another embodiment of the present disclosure, a rolling direction of the two display units DP' and DP" can be set as needed.

Implementation of Infinite Expansion

Figure 15:
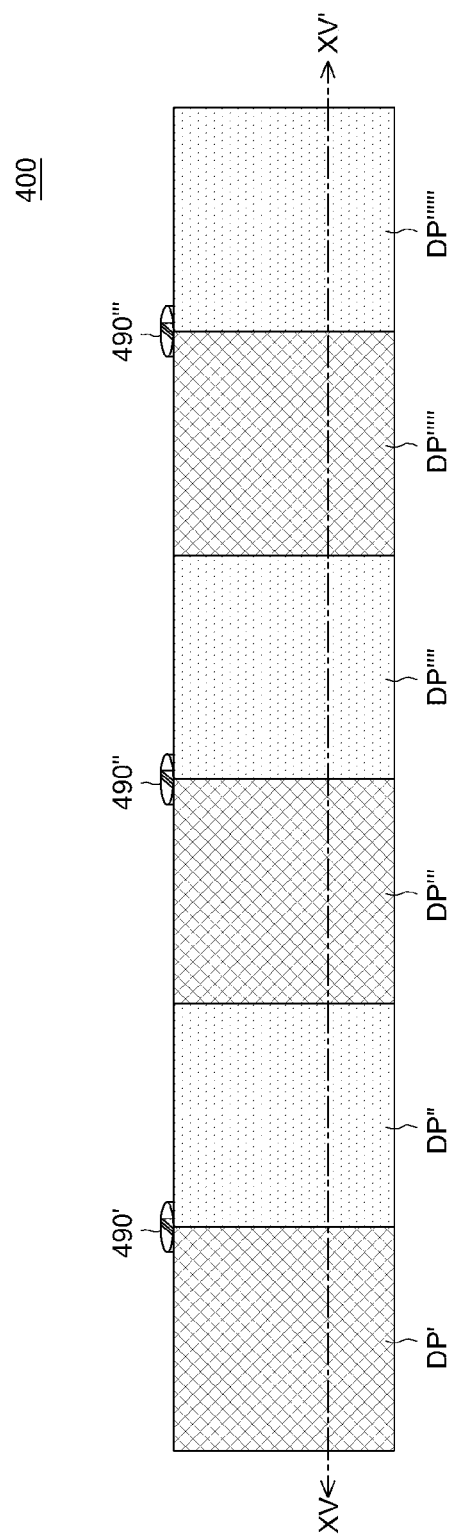
FIG. 15 is a perspective view of a display device according to still another embodiment of the present disclosure.
Figure 16A:
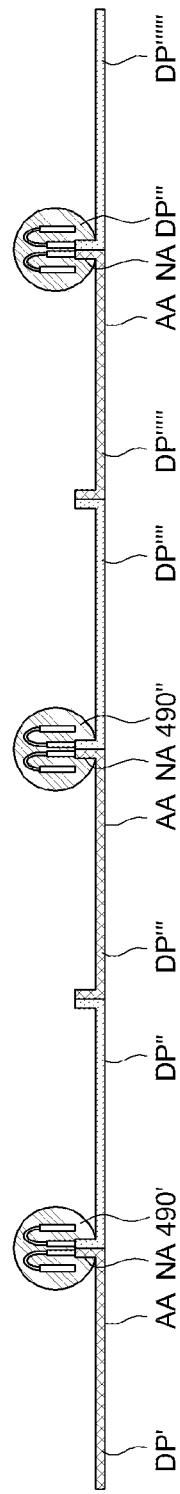
FIG. 16A is a cross-sectional view as taken along a line XV-XV' of FIG. 15.
Figure 16B:
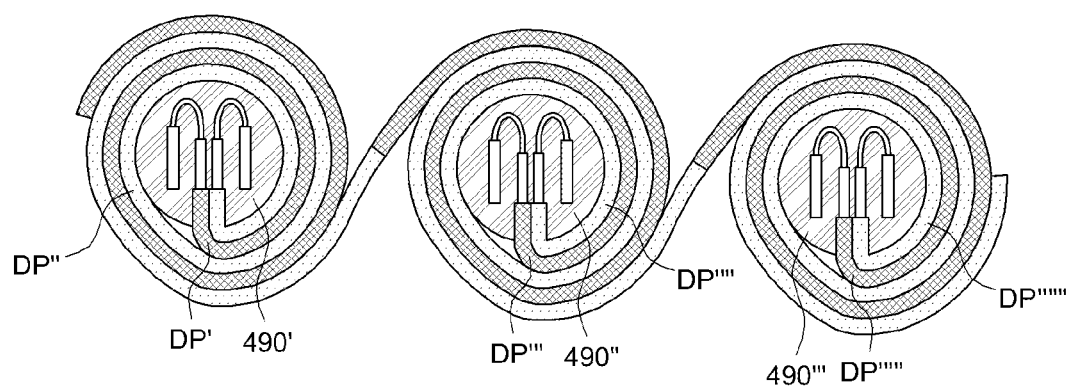
FIG. 16B is a cross-sectional view of the display device of FIG. 15 which is rolled up.
Figure 17:
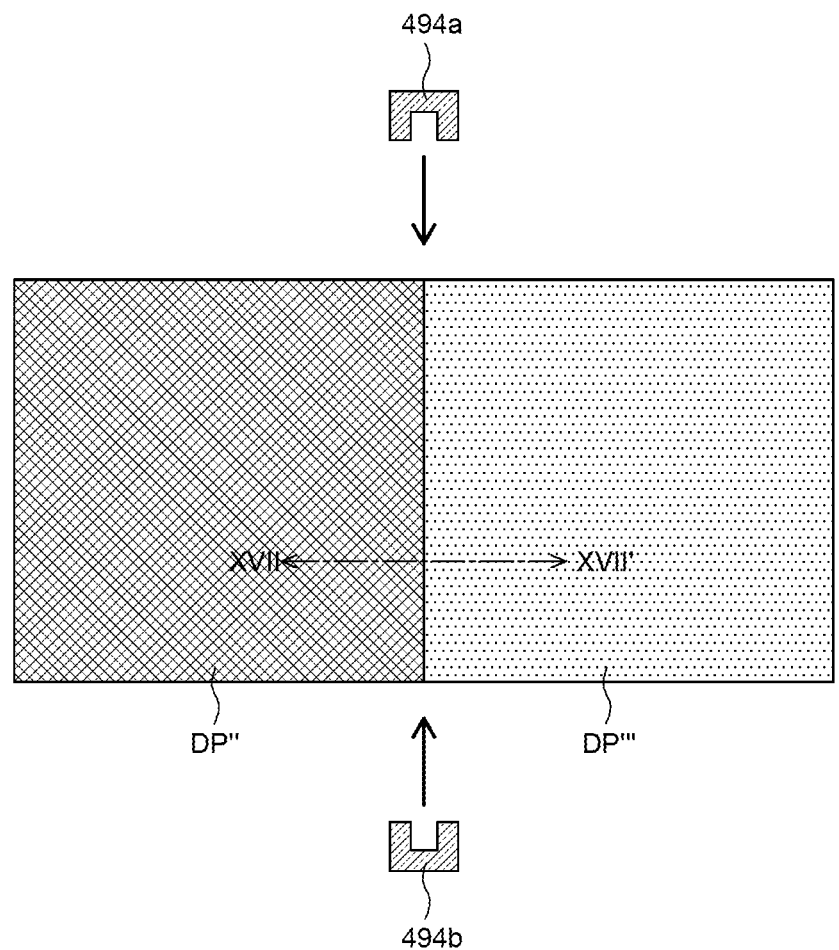
FIG. 17 is a plan view showing a part of the display device of FIG. 15.
Figure 18:
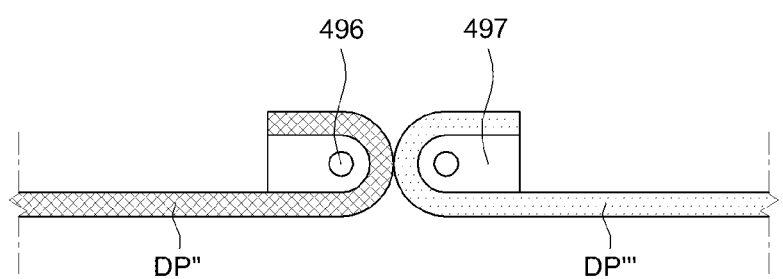
FIG. 18 is a cross-sectional view as taken along a line XVII-XVII' of FIG. 17.

FIG. 15 is a perspective view of a display device according to still another embodiment of the present disclosure. FIG. 16A is a cross-sectional view as taken along a line XV-XV' of FIG. 15. FIG. 16B is a cross-sectional view of the display device of FIG. 15 which is rolled up. FIG. 17 is a plan view showing a part of the display device of FIG. 15. FIG. 18 is a cross-sectional view as taken along a line XVII-XVII' of FIG. 17. A display device 400 shown in FIG. 15 through FIG. 18 has substantially the same configuration as the display device 100 shown in FIG. 1 through FIG. 10 except an increase in the number of display units DP', DP", DP''', DP'''', DP''''', and DP''''''. Therefore, redundant description of the same components will not be provided.

Referring to FIG. 15, FIG. 16A and FIG. 16B, the display device 400 according to still another embodiment of the present disclosure may include at least four the display units DP', DP", DP''', DP'''', DP''''', and DP''''''. Further, the display device 400 may include at least two rolling units 490', 490", and 490'''. FIG. 15, FIG. 16A and FIG. 16B illustrate six display units DP', DP", DP''', DP'''', DP''''', and DP'''''' and three rolling units 490', 490", and 490'''. However, the number of display units DP', DP", DP''', DP'''', DP''''', and DP'''''' and the number of rolling units 490', 490", and 490''' are not limited thereto and can increase infinitely in the transverse direction. In this case, the number of display units DP', DP", DP''', DP'''', DP''''', and DP'''''' is 2n (n is a natural number) and the number of rolling units 490', 490", and 490''' is n.

In the display device 400 according to still another embodiment of the present disclosure, the large-area display unit DP', DP", DP''', DP'''', DP''''', and DP'''''' can be implemented by tiling four or more display units DP', DP", DP''', DP'''', DR''''', and DP'''''' in a horizontal direction.

The display units DP', DP", DP''', DP'''', DP''''', and DP'''''' are configured to display images to the user. Each of the display units DP', DP", DP''', DP'''', DP''''', and DP'''''' may include a back cover, a display panel, a source printed circuit board, a flexible cable, and a control printed circuit board.

Two adjacent display units of the four or more display units DP', DP", DP''', DP'''', DP''''', and DP'''''' may be tiled to each other at a pad portion or a non-pad portion in a non-active area NA and thus can be expanded infinitely. The tiled pad portions or non-pad portions may be inserted and fastened in the rolling unit 490', 490", and 490''' disposed in the middle of the two adjacent display units DP', DP", DP''', DP'''', DP''''', and DP''''''.

As shown in FIG. 15, FIG. 16A and FIG. 16B, edge-bending can be applied to the pad portions in the non-active area NA. For example, inward rolling can be applied to each of the left display units DP', DP''', and DP''''' and outward rolling can be applied to each of the right display units DP", DP'''', and DP'''''', which can be expanded infinitely.

In the display device 400 according to still another embodiment of the present disclosure, a single rolling unit 490', 490", and 490''' is disposed in the middle of the two adjacent display units DP', DP", DP''', DP'''', DP''''', and DP''''''.

According to still another embodiment of the present disclosure, a tile portion between the display units DP', DP", DP''', DP'''', DP''''', and DP'''''' is disposed at the pad portion in the non-active area NA. In this case, the non-pad portion of the non-active area NA may be located in the lateral outer periphery of the display units DP', DP", DP''', DP'''', DP''''', and DP''''''. However, the present disclosure is not limited thereto.

Two adjacent display units DP', DP", DP''', DP'''', DP''''', and DP'''''' may be housed as wound around outer surfaces of the rolling units 490', 490", and 490''', respectively, by inward and/or outward rolling, but are not limited thereto.

The display units DP', DP", DP''', DP'''', DP''''', and DP'''''' of the display device 400 according to still another embodiment of the present disclosure may transition from the full unwinding state to the full winding state or from the full winding state to the full unwinding state.

FIG. 15 and FIG. 16A illustrate the full unwinding state of the display units DP', DP", DP''', DP'''', DP''''', and DP'''''' of the display device 400. The full unwinding state refers to a state where the display units DP', DP", DP''', DP'''', DP''''', and DP'''''' of the display device 400 are unwound and fully spread.

FIG. 16B illustrates the full winding state of the display units DP', DP", DP''', DP'''', DP''''', and DP'''''' of the display device 400. The full winding state refers to a state where the display units DP', DP", DP''', DP'''', DP''''', and DP'''''' of the display device 400 are fully wound around the outer surfaces of the rolling units 490', 490", and 490''', respectively, by inward and/or outward rolling.

In the display device 400 according to still another embodiment of the present disclosure, each of the rolling units 490', 490", and 490''' may further include a moving unit (not shown) to move the display device 400 and fix the display units DP', DP", DP''', DP'''', DP''''', and DP''''''.

Further, each of the rolling units 490', 490", and 490''' may include a fastening unit in which one end of the display unit DP', DP", DP''', DP'''', DP''''', and DP'''''' is inserted. Each of the rolling units 490', 490", and 490''' may also include a body which is fastened and fixed to the fastening unit in a state where the control printed circuit board is inserted.

Each of the rolling units 490', 490", and 490''' may further include a moving unit on the lower side thereof. The moving unit is configured to move the display device 400 and roll or fix the display units DP', DP", DP''', DP'''', DP''''', and DP''''''.

Referring to FIG. 17 and FIG. 18, non-pad portions of the non-active area NA in the lateral outer periphery of the four or more display units DP', DP", DP''', DP'''', DP''''', and DP'''''' are tiled to each other and fastened by fastening members 494a and 494b. Thus, the display units DP', DP", DP''', DP'''', DP''''', and DP'''''' expanded infinitely in the transverse direction can be connected to each other.

For example, a part of the lateral outer periphery of the right display unit DP" of two adjacent display units DP' and DP" and a part of the lateral outer periphery of the left display unit DP'" of two adjacent display units DP'" and DP"" may be tiled to each other.

In this case, the part of the lateral outer periphery of the right display unit DP" and the part of the lateral outer periphery of the left display unit DP'" may be edge-bent as wound around respective bending frames 497. The right display unit DP" and the left display unit DP'" edge-bent as wound around the respective bending frames 497 may be fixed by inserting upper and lower fastening members 494*a* and 494*b* into insertion holes 496 provided in the respective bending frames 497.

The part of the lateral outer periphery of the right display unit DP" and the part of the lateral outer periphery of the left display unit DP'" may be wound around the respective bending frames 497 with an adhesive. However, the present disclosure is not limited thereto.

In the display device 400 according to still another embodiment of the present disclosure, a plurality of display units DP', DP", DP'", DP"", DP""', and DP""" can be expanded infinitely using the upper and lower fastening members 494*a* and 494*b*. Therefore, in the display device 400 according to still another embodiment of the present disclosure, the size of the display device 400 can be set freely using the plurality of display units DP', DP", DP'", DP"", DP""', and DP""".

The exemplary embodiments of the present disclosure can also be described as follows:

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

The invention claimed is:

1. A display device, comprising:
a first display panel and a first back cover coupled to a rear surface of the first display panel;
a second display panel and a second back cover coupled to a rear surface of the second display panel, wherein the second display panel is adjacent to the first display panel; and
a first roller, wherein a non-active area of the first display panel is located inside the first roller and a non-active area of the second display panel is located inside the first roller, wherein the first roller is configured to wind and unwind the first and second display panels.

2. The display device according to claim 1, further comprising:
a flexible film electrically connected to one end of the first display panel;
a source printed circuit board electrically connected to the flexible film;
a control printed circuit board electrically connected to the source printed circuit board; and
a flexible cable that electrically connects the source printed circuit board to the control printed circuit board.

3. The display device according to claim 2, wherein the first roller is located at a middle of the first and second display panels.

4. The display device according to claim 3, wherein the flexible film, the source printed circuit board, the flexible cable, and the control printed circuit board are in the roller.

5. The display device according to claim 1, wherein the first display panel is rolled inwards and the second display panel is rolled outwards.

6. The display device according to claim 5, wherein the first and second display panels are wound around an outer surface of the first roller.

7. The display device according to claim 6, wherein when the first roller rotates in a first direction, the second display panel is wound around the first roller by outward rolling so that a rear surface of the second display panel is brought into contact with the outer surface of the first roller and the first display panel is wound around the first roller by inward rolling so that a front surface of the first display panel is brought into contact with a front surface of the second display panel.

8. The display device according to claim 4, wherein the first roller includes:
a core portion, wherein the non-active areas of the first and second display panels are located in the core portion of the first roller; and
a body portion fastened to the core portion, wherein the control printed circuit board is located in the body portion.

9. The display device according to claim 8, wherein the body portion includes a pressing member configured to fasten the body portion to the core portion or wind or unwind the first and second display panels.

10. The display device according to claim 8, wherein the first roller includes a wheeled base portion configured to roll and fix the first and second display panels.

11. The display device according to claim 1, further comprising:
a second roller, wherein a second non-active area of the first display panel is located inside the second roller.

12. The display device according to claim 11, wherein an end of the first back cover is fastened to the second roller.

13. The display device according to claim 11, further comprising:
a first support rail fastened to the first roller and to an upper end of the second roller; and
a second support rail fastened to the first roller and to a lower end of the second roller.

14. The display device according to claim 13, further comprising:
a plurality of fastening members that fasten the first and second support rails to the first roller and to the upper and lower ends of the second roller.

15. The display device according to claim 1, wherein the first display panel is rolled inwards or rolled outwards and the second display panel is rolled inwards or rolled outwards.

16. The display device according to claim 1, wherein a second non-active area of the first display panel and a second non-active area of the second display panel are edge-bent and tiled to each other, a third non-active area of the first display panel is edge-bent and wound around a first bending frame, and a third non-active area of the second display panel is edge-bent and wound around a second bending frame.

17. The display device according to claim 16, wherein the first display panel and the second display panel are fixed by upper and lower fastening members that are inserted into insertion holes in the first and second bending frames.

18. A display device, comprising:
a first display panel and a second display panel adjacent to the first display panel; and
a first roller, wherein a non-active area of the first display panel is located in the first roller and a non-active area of the second display panel is located in the first roller, wherein the first and second display panels are wound about the first roller.

19. The display device according to claim 18, wherein the first display panel is wound around an outer surface of the first roller by inward rolling and the second display panel is wound around the outer surface of the first roller by outward rolling.

20. The display device according to claim 18, further comprising:
a second roller fastened to a second non-active area of the first display panel, wherein the first display panel is wound around an outer surface of the first roller by inward rolling and the second display panel is wound around the outer surface of the first roller by outward rolling.

21. A rollable display device, comprising:
a first rollable display having a first lateral side portion and a second lateral side portion opposite to the first lateral side portion;
a second rollable display having a first lateral side portion and a second lateral side portion opposite to the first lateral side portion; and
a roller, the second lateral side portion of the first rollable display coupled to the roller and the first lateral side portion of the second rollable display coupled to the roller;
wherein the second lateral side portion of the first rollable display is adjacent to the first lateral side portion of the second rollable display.

22. The rollable display device of claim 21 wherein the first rollable display is a first tile within a large area display and the second rollable display is a second tile within the large area display.

23. The rollable display device of claim 21 wherein an active area of the first rollable display is not separated from an active area of the second rollable display by a bezel and the active area of the first rollable display forms a continuous image with the active area of the second rollable display.

24. The rollable display device of claim 21 wherein:
the first rollable display has a top edge and the second rollable display has a top edge that is continuous with the top edge of the first rollable display; and
the first rollable display has a bottom edge and the second rollable display has a bottom edge that is continuous with the bottom edge of the first rollable display.

25. The rollable display device of claim 21 wherein the first rollable display and the second rollable display collectively form a large area display that extends from the first lateral side portion of the first rollable display to the second lateral side portion of the second rollable display.

26. The rollable display device of claim 21, wherein the second rollable display is rollable about the roller with a rear surface of the second rollable display in direct contact with an outer surface of the roller and the first rollable display is rollable about the roller with a front surface of the first rollable display in direct contact with a front surface of the second rollable display.

27. The rollable display device of claim 26, further comprising:
a third rollable display having a first lateral side portion and a second lateral side portion opposite to the first lateral side portion;
a fourth rollable display having a first lateral side portion and a second lateral side portion opposite to the first lateral side portion; and
a second roller, the second lateral side portion of the third rollable display coupled to the second roller and the first lateral side portion of the fourth rollable display coupled to the second roller;
wherein the fourth rollable display is rollable about the second roller with a rear surface of the fourth rollable display in direct contact with an outer surface of the second roller and the third rollable display is rollable about the second roller with a front surface of the third rollable display in direct contact with a front surface of the fourth rollable display;
wherein the second lateral side portion of the second rollable display is coupled to the first lateral side portion of the third rollable display.

28. The rollable display device of claim 21, further comprising:
a first source printed circuit board located inside the roller and a second source printed circuit board located inside the roller, the second lateral side portion of the first rollable display coupled to the first source printed circuit board and the first lateral side portion of the second rollable display coupled to the second source printed circuit board; and
a first control printed circuit board located inside the roller and electrically coupled to the first source printed circuit board by a first flexible cable and a second control printed circuit board located inside the roller and electrically coupled to the second source printed circuit board by a second flexible cable.

29. The rollable display device of claim 28, further comprising:
a first flexible film inside the roller, wherein the first source printed circuit board is electrically coupled to the first rollable display by the first flexible film; and
a second flexible film inside the roller, wherein the second source printed circuit board is electrically coupled to the second rollable display by the second flexible film.

30. The rollable display device of claim 29 wherein the first flexible film is electrically coupled to a pad portion of the first rollable display, wherein the pad portion of the first rollable display is located within the roller, and the second flexible film is electrically coupled to a pad portion of the second rollable display, wherein the pad portion of the second rollable display is located within the roller.

31. The rollable display device of claim 30 wherein the roller includes a core portion and a separate body fastened to the core portion.

32. The rollable display device of claim 31 wherein the first source printed circuit board is located within the core portion of the roller.

33. The rollable display device of claim 32 wherein a first portion of the first flexible cable is located within the core portion of the roller and a second portion of the first flexible cable is located within the separate body of the roller.

34. The rollable display device of claim 33 wherein the first control printed circuit board is located within the separate body of the roller.

35. The rollable display device of claim 34 wherein the separate body is fastened to the core portion by a hinge.

* * * * *